United States Patent
Eguchi et al.

(10) Patent No.: US 9,570,329 B2
(45) Date of Patent: Feb. 14, 2017

(54) PEELING APPARATUS AND MANUFACTURING APPARATUS OF SEMICONDUCTOR DEVICE

(71) Applicant: Semiconductor Energy Laboratory Co., Ltd., Atsugi-shi, Kanagawa-ken (JP)

(72) Inventors: Shingo Eguchi, Tochigi (JP); Yohei Monma, Tochigi (JP); Atsuhiro Tani, Utsunomiya (JP); Misako Hirosue, Naka (JP); Kenichi Hashimoto, Shimotsuga (JP); Yasuharu Hosaka, Shimotsuga (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/204,091

(22) Filed: Jul. 7, 2016

(65) Prior Publication Data
US 2016/0314999 A1    Oct. 27, 2016

Related U.S. Application Data

(60) Continuation of application No. 14/801,093, filed on Jul. 16, 2015, now Pat. No. 9,397,126, which is a (Continued)

(30) Foreign Application Priority Data

Sep. 29, 2006 (JP) .................................. 2006-266531

(51) Int. Cl.
*H01L 31/18* (2006.01)
*H01L 21/67* (2006.01)
(Continued)

(52) U.S. Cl.
CPC ....... *H01L 21/67132* (2013.01); *B32B 43/006* (2013.01); *H01L 21/6835* (2013.01);
(Continued)

(58) Field of Classification Search
CPC ........................... H01L 31/1892; H01L 31/206
(Continued)

(56) References Cited

U.S. PATENT DOCUMENTS 5,821,138 A    10/1998   Yamazaki et al.
5,854,123 A    12/1998   Sato et al.
(Continued)

FOREIGN PATENT DOCUMENTS

EP    0848415 A    6/1998
EP    1069602 A    1/2001
(Continued)

OTHER PUBLICATIONS

Chinese Office Action (Application No. 200710153241.X) Dated Oct. 25, 2011.

*Primary Examiner* — George Fourson, III
(74) *Attorney, Agent, or Firm* — Robinson Intellectual Property Law Office; Eric J. Robinson

(57) ABSTRACT

To eliminate electric discharge when an element formation layer including a semiconductor element is peeled from a substrate used for manufacturing the semiconductor element, a substrate over which an element formation layer and a peeling layer are formed and a film are made to go through a gap between pressurization rollers. The film is attached to the element formation layer between the pressurization rollers, bent along a curved surface of the pressurization roller on a side of the pressurization rollers, and collected. Peeling is generated between the element formation layer and the peeling layer and the element formation layer is transferred to the film. Liquid is sequentially supplied by a
(Continued)

nozzle to a gap between the element formation layer and the peeling layer, which is generated by peeling, so that electric charge generated on surfaces of the element formation layer and the peeling layer is diffused by the liquid.

20 Claims, 13 Drawing Sheets

Related U.S. Application Data continuation of application No. 14/540,348, filed on Nov. 13, 2014, now Pat. No. 9,087,931, which is a continuation of application No. 13/406,603, filed on Feb. 28, 2012, now Pat. No. 8,889,438, which is a division of application No. 11/902,514, filed on Sep. 21, 2007, now Pat. No. 8,137,417.

(51) Int. Cl.
  H01L 27/12    (2006.01)
  H01L 21/683   (2006.01)
  B32B 43/00    (2006.01)
  H01L 31/20    (2006.01)

(52) U.S. Cl.
  CPC ...... H01L 27/1218 (2013.01); H01L 27/1266 (2013.01); H01L 31/1892 (2013.01); H01L 31/206 (2013.01); H01L 2221/6835 (2013.01); H01L 2221/68363 (2013.01); H01L 2221/68395 (2013.01)

(58) Field of Classification Search
  USPC ................. 438/62, 484, 977; 29/25.01
  See application file for complete search history.

(56) References Cited

U.S. PATENT DOCUMENTS

| 5,891,298 | A  | 4/1999  | Kuroda et al. |
|---|---|---|---|
| 6,072,239 | A  | 6/2000  | Yoneda et al. |
| 6,100,166 | A  | 8/2000  | Sakaguchi et al. |
| 6,127,199 | A  | 10/2000 | Inoue et al. |
| 6,326,279 | B1 | 12/2001 | Kakizaki et al. |
| 6,372,608 | B1 | 4/2002  | Shimoda et al. |
| 6,391,220 | B1 | 5/2002  | Zhang et al. |
| 6,452,091 | B1 | 9/2002  | Nakagawa et al. |
| 6,544,430 | B2 | 4/2003  | Mccormack et al. |
| 6,592,739 | B1 | 7/2003  | Sonoda et al. |
| 6,645,830 | B2 | 11/2003 | Shimoda et al. |
| 6,682,963 | B2 | 1/2004  | Ishikawa |
| 6,818,530 | B2 | 11/2004 | Shimoda et al. |
| 6,849,877 | B2 | 2/2005  | Yamazaki et al. |
| 6,953,735 | B2 | 10/2005 | Yamazaki et al. |
| 6,982,181 | B2 | 1/2006  | Hideo |
| 7,015,075 | B2 | 3/2006  | Fay et al. |
| 7,029,950 | B2 | 4/2006  | Yonehara et al. |
| 7,060,153 | B2 | 6/2006  | Yamazaki et al. |
| 7,060,591 | B2 | 6/2006  | Yamazaki et al. |
| 7,067,392 | B2 | 6/2006  | Yamazaki et al. |
| 7,094,665 | B2 | 8/2006  | Shimoda et al. |
| 7,147,740 | B2 | 12/2006 | Takayama et al. |
| 7,235,141 | B2 | 6/2007  | Suzuki et al. |
| 7,241,666 | B2 | 7/2007  | Goto et al. |
| 7,271,076 | B2 | 9/2007  | Yamazaki et al. |
| 7,285,476 | B2 | 10/2007 | Shimoda et al. |
| 7,332,381 | B2 | 2/2008  | Maruyama et al. |
| 7,351,300 | B2 | 4/2008  | Takayama et al. |
| 7,446,339 | B2 | 11/2008 | Yamazaki et al. |
| 7,465,674 | B2 | 12/2008 | Tamura et al. |
| 7,482,248 | B2 | 1/2009  | Tamura |
| 7,536,780 | B2 | 5/2009  | Shimizu et al. |
| 7,540,079 | B2 | 6/2009  | Okuyama et al. |
| 7,566,633 | B2 | 7/2009  | Koyama et al. |
| 7,591,863 | B2 | 9/2009  | Watanabe et al. |
| 7,601,236 | B2 | 10/2009 | Yamashita et al. |
| 7,648,862 | B2 | 1/2010  | Maruyama et al. |
| 7,704,765 | B2 | 4/2010  | Maruyama et al. |
| 7,767,543 | B2 | 8/2010  | Tateishi et al. |
| 7,927,971 | B2 | 4/2011  | Tamura et al. |
| 2003/0032210 | A1 | 2/2003  | Takayama et al. |
| 2004/0209442 | A1 | 10/2004 | Takakuwa et al. |
| 2005/0148121 | A1 | 7/2005  | Yamazaki et al. |
| 2005/0229370 | A1 | 10/2005 | Kobayashi |
| 2005/0266591 | A1 | 12/2005 | Hideo |
| 2006/0030122 | A1 | 2/2006  | Shimoda et al. |
| 2006/0121694 | A1 | 6/2006  | Tamura |
| 2006/0128065 | A1 | 6/2006  | Inada et al. |
| 2006/0199382 | A1 | 9/2006  | Sugiyama et al. |
| 2007/0010067 | A1 | 1/2007  | Shimoda et al. |
| 2007/0078228 | A1 | 4/2007  | Tateishi et al. |
| 2007/0166954 | A1 | 7/2007  | Yamazaki et al. |
| 2007/0176234 | A1 | 8/2007  | Yamazaki et al. |
| 2007/0196999 | A1 | 8/2007  | Tamura et al. |
| 2007/0243352 | A1 | 10/2007 | Takayama et al. |
| 2008/0011420 | A1 | 1/2008  | Yoshizawa et al. |
| 2008/0042168 | A1 | 2/2008  | Watanabe et al. |
| 2008/0044940 | A1 | 2/2008  | Watanabe et al. |
| 2008/0132033 | A1 | 6/2008  | Eguchi et al. |
| 2008/0259575 | A1 | 10/2008 | Tanimura et al. |
| 2009/0017567 | A1 | 1/2009  | Eguchi et al. |
| 2009/0017599 | A1 | 1/2009  | Eguchi et al. |
| 2009/0023251 | A1 | 1/2009  | Eguchi et al. |
| 2009/0042387 | A1 | 2/2009  | Yamada et al. |
| 2009/0194771 | A1 | 8/2009  | Koyama et al. |
| 2010/0096090 | A1 | 4/2010  | Yoshioka et al. |
| 2010/0148179 | A1 | 6/2010  | Maruyama et al. |
| 2011/0171778 | A1 | 7/2011  | Tamura et al. |
| 2012/0045861 | A1 | 2/2012  | Eguchi et al. |

FOREIGN PATENT DOCUMENTS

| EP | 1363319 A       | 11/2003 |
|---|---|---|
| JP | 63-261761 A     | 10/1988 |
| JP | 01-200331 A     | 8/1989  |
| JP | 09-100448 A     | 4/1997  |
| JP | 10-125931 A     | 5/1998  |
| JP | 11-186307 A     | 7/1999  |
| JP | 2000-227955 A   | 8/2000  |
| JP | 2000-279852 A   | 10/2000 |
| JP | 2001-328849 A   | 11/2001 |
| JP | 2001-331120 A   | 11/2001 |
| JP | 2002-043396 A   | 2/2002  |
| JP | 2002-206194 A   | 7/2002  |
| JP | 2003-174153 A   | 6/2003  |
| JP | 2003-237263 A   | 8/2003  |
| JP | 2004-158765 A   | 6/2004  |
| JP | 2004-311955 A   | 11/2004 |
| JP | 2005-079395 A   | 3/2005  |
| JP | 2005-079553 A   | 3/2005  |
| JP | 2006-066899 A   | 3/2006  |
| JP | 2006-066906 A   | 3/2006  |
| JP | 2006-135305 A   | 5/2006  |
| JP | 2006-186347 A   | 7/2006  |
| JP | 2006-202820 A   | 8/2006  |
| JP | 2006-216891 A   | 8/2006  |
| JP | 2006-259095 A   | 9/2006  |
| JP | 2007-184495 A   | 7/2007  |
| KR | 1999-0028523 A  | 4/1999  |
| KR | 2005-0048517 A  | 5/2005  |
| WO | WO-2006/003816  | 1/2006  |
| WO | WO-2006/011664  | 2/2006  |
| WO | WO-2006/011665  | 2/2006  |

PEELING APPARATUS AND MANUFACTURING APPARATUS OF SEMICONDUCTOR DEVICE

BACKGROUND OF THE INVENTION

1. Field of the Invention

The present invention relates to a peeling apparatus by which a layer including a structure, which is formed over a substrate, is peeled from the substrate. In particular, the present invention relates to a peeling apparatus used for manufacturing a semiconductor device, and a manufacturing apparatus of a semiconductor device for separating an element formation layer including a semiconductor element from a substrate used at the time of manufacture.

In the present invention, a semiconductor device for being manufactured includes a semiconductor element that can operate by utilizing semiconductor characteristics and a general device that operates by using a plurality of semiconductor elements.

As the semiconductor element, for example, a transistor, such as a MOS transistor or a thin film transistor, a diode, a MOS capacitor, and the like are given. In addition, the semiconductor device refers to an integrated circuit having a plurality of semiconductor elements, a device having a plurality of integrated circuits, a device having an integrated circuit and another element, or the like. The integrated circuit refers to, for example, a memory circuit such as a CPU, ROM, or RAM.

The device having a plurality of integrated circuits and the device having an integrated circuit and another element include, for example, a liquid crystal module substrate, a liquid crystal module using this module substrate, a liquid crystal display device using this module substrate, an EL (electroluminescence) module substrate, an EL module using this module substrate, an EL display device using this module substrate, an electronic appliance in which the liquid crystal module or the EL module is used as a display unit, an IC chip which is provided with an antenna and can communicate wirelessly, an electronic tag on which such an IC chip is mounted, an IC card, and the like.

2. Description of the Related Art

A technique has been developed in which after an integrated circuit is formed of a semiconductor element such as a TFT over a substrate such as a glass substrate or a quartz substrate, the integrated circuit is transferred from the substrate used for manufacturing the integrated circuit to a plastic film substrate. First, a step of peeling an integrated circuit from a substrate used for manufacture is needed in order to transfer the integrated circuit to another substrate. Thus, a technique has been developed by which an integrated circuit is peeled from a substrate.

For example, in Patent Document 1 (Japanese Published Patent Application No. H10-125931), the following peeling technique using laser ablation is described. A separation layer formed of amorphous silicon is faulted over a substrate, a layer to be peeled which is formed of a thin film element is formed over the separation layer, and the layer to be peeled is bonded to an object to which the layer to be peeled is transferred, by a bonding layer. The separation layer is ablated by laser light irradiation, so that peeling of the separation layer is generated.

In addition, in Patent Document 2 (Japanese Published Patent Application No. 2003-174153), a technique is described in which peeling is performed by physical force such as that by human hands. In Patent Document 2, a metal layer is formed between a substrate and an oxide layer and peeling is generated at an interface between the oxide layer and the metal layer with the utilization of weak bonding of the oxide layer and the metal layer at the interface, so that the layer to be peeled and the substrate are separated from each other.

It has been known that when peeling is generated, electric charge is generated on surfaces of two separated layers and electrification is easily generated. This phenomenon is referred to as peeling electrification. Since the surfaces of two layers are close to each other at the moment of peeling, electric capacity is formed between these surfaces. When peeling proceeds, electric capacity is decreased with increase in a distance between the two layers; however, the amount of electric charge generated by peeling electrification is not changed, and thus, electric potential of the surface of the layer is increased inversely proportional to the electric capacity. When the electric potential of the surface of a peeled layer is increased, electric charge which is charged on the surface of the layer might be discharged toward inside the layer.

Accordingly, in the case where an object to be peeled is an integrated circuit, a semiconductor film, an insulating film, a conductive film, or the like is destroyed by melting due to heat generated by electric discharge. Consequently, a semiconductor element does not function in some cases. Even when the semiconductor element can operate without receiving a visible damage, a semiconductor or an insulator deteriorates due to high electric potential application and the semiconductor element does not show expected characteristics in some cases. Therefore, when electric discharge due to static electricity is generated, the semiconductor element is destroyed, or the integrated circuit itself using the semiconductor element does not operate normally due to characteristic deterioration in some cases.

Destruction of a semiconductor element or the like by electric discharge due to static electricity is referred to as electrostatic breakdown. Electrostatic breakdown is one of causes which drastically reduce yield. As a conventional method of avoiding electrostatic breakdown, there are a method in which electric discharge due to static electricity is tried not to be generated and a method in which damage to a semiconductor element caused by electric discharge is suppressed even when electric discharge due to static electricity is generated. As the former method, a method of removing generated static electricity by providing an ionizer in a semiconductor manufacturing apparatus is known. A typical example of the latter method is a method of manufacturing a protective circuit with a semiconductor element, and high electric potential generated by electric discharge can be prevented from being applied to a semiconductor element because of the protective circuit.

Even if static electricity is generated, electrostatic breakdown is not generated as long as electric discharge is not performed. Electric discharge is easily generated when electric potential difference between two objects is large. Therefore, an ionizer is an apparatus for supplying a positive ion and a negative ion to the air which serves as a path of electric discharge and for preventing generation of a large electric potential difference between the objects, as electric discharge is increased. However, since electric discharge due to peeling electrification is generated instantaneously when two layers are separated, electricity is not removed in time by an ionizer in some cases.

In addition, in the case of providing a protective circuit, when electric charge of electric discharge passes through the protective circuit, the protective circuit functions; therefore, destruction of a semiconductor element can be avoided.

However, since surfaces of two layers to be separated are charged in peeling electrification, the electric discharge does not always pass through the protective circuit. Accordingly, in peeling electrification, electrostatic breakdown is not sufficiently prevented by the protective circuit.

For example, a method for preventing electric discharge due to peeling electrification is described in Patent Document 3 (Japanese Published Patent Application No. 2005-79395) (see Scope of Claims, Lines 42 to 48 in Page 9). Here, a conductive film is formed over a substrate, and a stacked body including a semiconductor element or the like is formed thereover. Peeling is generated at an interface between the substrate and the conductive film and electric charge generated at the time of peeling is diffused into the conductive film, so that destruction or characteristic deterioration of the semiconductor element due to charge is avoided.

However, in the peeling method of Patent Document 3, the conductive film remains in a lower part of the stacked body. Depending on an intended purpose of the stacked body, the conductive film becomes an obstacle and an expected intended purpose cannot be carried out due to the conductive film in some cases. In such a case, a conductive film is needed to be removed in the peeling method of Patent Document 3.

SUMMARY OF THE INVENTION

It is an object of the present invention to provide an apparatus for peeling process, which is capable of preventing destruction or characteristic deterioration of a semiconductor element due to electric charge generated by peeling. In addition, in Patent Document 3, there is a limitation on the structure including the conductive film on the lower surface of the semiconductor element after peeling; however, in the present invention, it is another object to provide an apparatus for peeling process, in which a high-resistance insulating material can be selected as a material for the layer on the surface of a semiconductor element after peeling.

In order to solve the above-described problem, the present invention provides a peeling apparatus for performing peeling process so that electric charge generated by peeling is not discharged into either of separated layers. Accordingly, one feature of a manufacturing apparatus of a semiconductor device of the present invention is to have a unit of wetting a surface which appears by separating an element formation layer including a semiconductor element from a substrate.

One feature of a manufacturing apparatus of a semiconductor device of the present invention is to include a unit of attaching a flexible substrate to an element formation layer and a unit of transforming the element fat illation layer by moving the flexible substrate. The element formation layer is transformed by transformation of the flexible substrate, thereby being separated from the substrate.

For wetting (including moistening) a surface which appears by peeling with liquid, liquid may be supplied to the surface which consecutively appears by peeling. As a supply unit of liquid, a nozzle for dropping or pouring liquid or a spray nozzle for spraying liquid in the form of a mist is used.

Another feature of a manufacturing apparatus of a semiconductor device of the present invention is to include a unit of attaching a flexible substrate to an element formation layer, a unit of moving the flexible substrate so as to transform the element formation layer, and a tank for liquid. The element formation layer is peeled in the tank, so that a surface which appears by separation of the element fog (nation layer can be wetted with liquid.

In addition, a technique of the present invention is not limited to a manufacturing method of a semiconductor device, but can be applied to a peeling apparatus which is used for peeling a layer including a structure in which one or a plurality of layers is stacked from a substrate. More specifically, a peeling apparatus of the present invention includes a unit of peeling a layer including a structure from a substrate while transforming the layer including a structure, and a unit of supplying liquid to a surface which appears by peeling of the layer including a structure.

Electric discharge is a phenomenon in that current flows instantaneously due to high electric potential difference in a region where current is not supposed to flow, such as an insulator or a semiconductor. A surface which appears by peeling is wetted or moistened, so that electric resistivity of the surface can be decreased. Consequently, electric charge generated by peeling electrification is diffused into the wetted surface, and thus electric potential of the surface which appears by peeling is not increased so much that electric discharge is generated. By peeling with the use of an apparatus of the present invention, electric discharge due to peeling electrification can be prevented.

In a manufacturing apparatus of the present invention, electric discharge due to peeling electrification is not generated; thus, yield of a step of separating a substrate and an element formation layer from each other can be increased. In addition, characteristic deterioration of a semiconductor element due to electrostatic breakdown can be prevented; thus, a highly reliable semiconductor device can be manufactured by the present invention.

Moreover, by an apparatus of the present invention, electric charge generated by peeling is not discharged into both separated layers; thus, even if the material on the lower surface of an element formation layer is formed of an insulating material, a semiconductor element included in the element formation layer can be prevented from being destroyed due to static electricity generated by peeling electrification and characteristic deterioration of the semiconductor element can be avoided. Therefore, with respect to a peeling apparatus and a manufacturing apparatus of a semiconductor device of the present invention, a material of a peeled object is not limited and has high versatility.

BRIEF DESCRIPTION OF THE DRAWINGS

In the accompanying drawings:

FIG. 19A is a front view of an EL module and FIG. 19B is a cross-sectional view of a liquid crystal module;

FIG. 20A is a front view of an EL module and FIG. 20B is a cross-sectional diagram of an EL module;

FIGS. 21A and 21B are appearance diagrams of a television device and FIG. 21C is an appearance diagram of an e-book reader;

DETAILED DESCRIPTION OF THE INVENTION

Embodiment Mode

Figure 1:
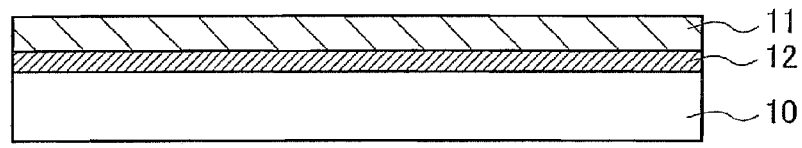
FIG. 1 is a cross-sectional diagram for explaining a manufacturing method of a semiconductor device and a diagram for explaining that an element formation layer 11 is formed over a substrate 10.

Embodiment mode of the present invention will be hereinafter explained with reference to the accompanying drawings. The same components are denoted by the same reference numeral and a repeated explanation is omitted. The present invention can be carried out in many different modes, and it is easily understood by those skilled in the art that modes and details of the present invention can be modified in various ways without departing from the purpose and the scope of the present invention. Therefore, the present invention should not be interpreted as being limited to the description of Embodiment Mode.

When static electricity is generated on a surface of a layer (including a substrate) formed of a high-resistance substance such as an insulator, electric charge remains in a position where the electric charge is generated if a path through which the electric charge is diffused does not exist. If peeling proceeds with this condition and electric potential by the generated electric charge is increased, electric discharge is generated toward a path through which electricity easily passes, for example, inside an element formation layer.

Therefore, a manufacturing apparatus of a semiconductor device of the present invention has a feature in that a unit by which electric discharge is not generated due to charge caused by peeling is included. Specifically, when an element separation layer is separated from a substrate, liquid is supplied between the two separated layers (including the case where one of the layers is a substrate), so that a surface which appears by separation of the element formation layer is wetted or moistened.

First, a principle of a peeling apparatus of the present invention is explained. Thus, a method for peeling an element formation layer and a method for manufacturing a semiconductor device using the peeled element formation layer are explained with reference to FIGS. 1 to 9.

Preparation of an element formation layer for being peeled is explained. As shown in FIG. 1, an element formation layer 11 is formed over a substrate 10. A peeling layer 12 is formed over the substrate 10 so that the element formation layer 11 can be easily separated from the substrate 10, and the element formation layer 11 is formed over the peeling layer 12.

At least one semiconductor element is formed in the element formation layer 11. For example, an integrated circuit is formed of a thin film transistor, a diode, a resistor, a capacitor, and the like in the element formation layer 11. The element formation layer 11 is one of component parts of a semiconductor device, and a plurality of component parts of the semiconductor device is formed in the element formation layer 11.

Figure 2:
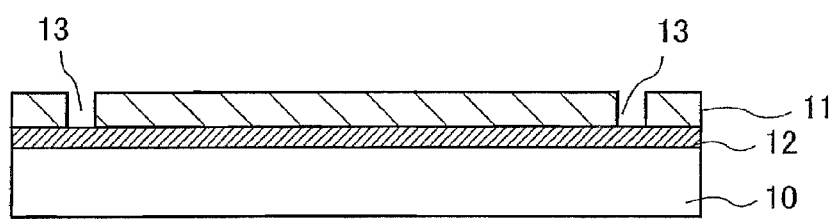
FIG. 2 is a cross-sectional diagram for explaining a manufacturing method of a semiconductor device and a diagram for explaining that a groove 13 is formed in an element formation layer 11.

After the element formation layer 11 is formed, grooves 13 are formed as shown in FIG. 2. For example, the grooves 13 are formed to surround a circumference of one component part (e.g., one integrated circuit) of the semiconductor device in the element formation layer 11. The formation of the grooves 13 makes it possible to divide the element formation layer 11 for each semiconductor devices when the element formation layer 11 is separated from the substrate 10. The grooves 13 can be formed by laser light irradiation. Moreover, the grooves 13 can be formed to surround the circumferences of all component parts of the semiconductor device formed over the substrate 10.

For example, the peeling layer 12 can be formed of a metal or an alloy. As a metal, the following is given: tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like. As an alloy, an alloy of a plurality of metal elements selected from the above-described metal elements, such as tungsten and molybdenum. A metal film and an alloy film of the element can be formed by sputtering. In addition, a thickness of a metal film or an alloy film which serves as the peeling layer 12 may be in the range of 20 to 100 nm.

A surface of the metal film or the alloy film formed as the peeling layer 12 is oxidized in order to preferentially generate peeling between the element formation layer 11 and the peeling layer 12. In this manner, by oxidation and formation of the grooves 13, peeling can be generated at an interface between the element formation layer 11 and the peeling layer 12, which appears by the grooves 13.

As a method for oxidizing the surface of the peeling layer 12, the following are given: a thermal oxidation method, a method for processing a surface with oxygen or $N_2O$ plasma, a method for processing a surface with a high-oxidative solution such as ozone water, and the like. As another method, there is a method in which oxide is formed at an interface between the element formation layer 11 and the peeling layer 12 when the element formation layer 11 is formed. For example, if silicon oxide is formed by sputtering, when silicon oxide is deposited on a surface of a metal film or an alloy film, the surface thereof can be oxidized. It is to be noted that the metal film or the alloy film may be nitrided by plasma treatment or heat treatment instead of being oxidized.

The peeling layer 12 can be formed of a single layer or a plurality of layers. For example, the peeling layer 12 can be forming of a multilayer film of a metal film (or an alloy film) and an insulating film formed of an insulating material such as silicon oxide or silicon oxynitride so that peeling is not generated at the interface between the substrate 10 and the peeling layer 12.

The substrate 10 is a substrate used for forming the element formation layer 11 and the peeling layer 12 and preferably rigid. The substrate 10 is, for example, a glass substrate, a quartz substrate, a metal substrate, a stainless steel substrate, a silicon wafer on which an insulating layer is formed, or the like.

Figure 3:
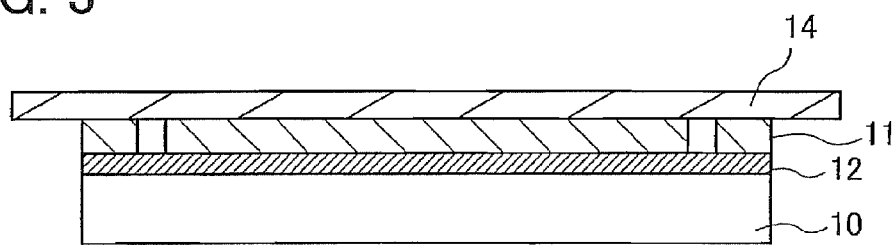
FIG. 3 is a cross-sectional diagram for explaining a manufacturing method of a semiconductor device and a diagram for explaining that a supporting substrate 14 is provided on an upper surface of an element formation layer 11.

After the grooves 13 are formed, as shown in FIG. 3, a supporting substrate 14 is fixed to the element formation layer 11. The supporting substrate 14 is a member for making it easier to handle the element formation layer 11 after the element formation layer 11 is separated from the substrate 10. In addition, the supporting substrate 14 is a member used for transforming the element formation layer 11 when the element formation layer 11 is separated from the substrate 10.

Since the supporting substrate 14 is not a member of the semiconductor device and is removed in a manufacturing process of the semiconductor device, a substrate which can be separated without damaging the element formation layer 11 is used for the supporting substrate 14. In addition, the supporting substrate 14 is formed of a flexible film so that the element formation layer 11 can be transformed. For example, a peeling film which can be peeled with weak force may be used for the supporting substrate 14.

It is to be noted that when the supporting substrate 14 is used as a member of the semiconductor device, a flexible film (made of polypropylene, polyester, vinyl, polyvinyl fluoride, polyvinyl chloride, or the like) is used as the supporting substrate 14 and bonded to the element formation layer 11 with an adhesive agent such as an epoxy resin in a structure of FIG. 3.

Figure 4:
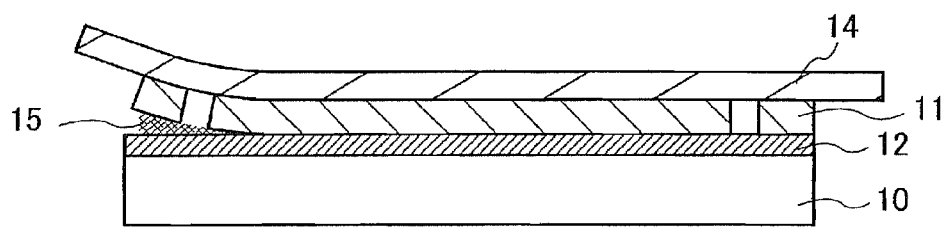
FIG. 4 is a cross-sectional diagram for explaining a manufacturing method of a semiconductor device and a cross-sectional diagram for explaining that peeling is generated at an interfacen between an element formation layer 11 and a peeling layer 12.

As shown in FIG. 4, peeling is generated at the interface between the element formation layer 11 and the peeling layer 12. The supporting substrate 14 is bent so that the element formation layer 11 is transformed, and accordingly, peeling is generated at an end portion of the interface between the element formation layer 11 and the peeling layer 12.

As shown in FIG. 4, after peeling is generated at the end portion of the interface between the element formation layer 11 and the peeling layer 12, liquid is supplied to a gap generated by peeling, so that a lower surface of the element formation layer 11 and an upper surface of the peeling layer 12 which appear by peeling are wetted. It is to be noted that when the substrate 10 is provided below and the supporting substrate 14 is provided above, the lower surface refers to the surface of a layer on the substrate 10 side and the upper surface refers to the surface of a layer on the supporting substrate 14 side.

Figure 5:
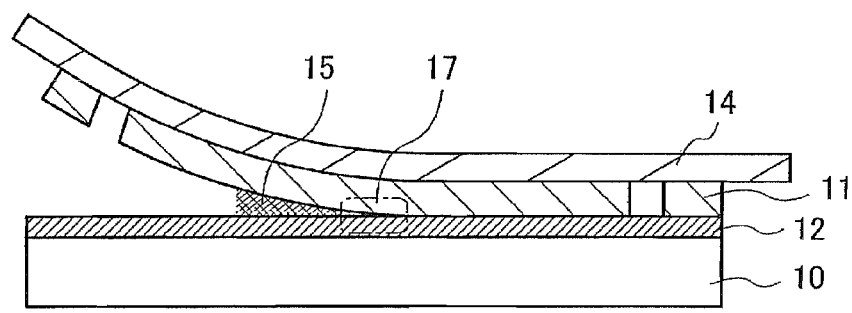
FIG. 5 is a cross-sectional diagram for explaining a manufacturing method of a semiconductor device and a diagram for showing that peeling proceeds at an interface between an element formation layer 11 and a peeling layer 12.

As shown in FIG. 5, the liquid 15 is supplied to an edge portion of peeling (a portion 17 surrounded by chained line in FIG. 5) so that the lower surface of the element formation layer 11 and the upper surface of the peeling layer 12, which appear by peeling, are wetted by the liquid 15, while peeling the element separation layer 11.

Electric charge due to peeling electrification is diffused through the liquid 15 in such a manner that the liquid 15 is supplied to a portion where peeling is to be generated to wet a surface which appears by peeling at the same time as generation of peeling; accordingly, discharge of static electricity can be prevented.

The liquid 15 for wetting the element formation layer 11 is preferably liquid which does not transform materials included in the element formation layer 11, the peeling layer 12, and the substrate 10. Alternatively, the liquid 15 is preferably liquid which does not generate a product by reaction with the materials. This is because a reaction product might contaminate the semiconductor device and a step of washing the reaction product is needed. It is preferable to select liquid, for the liquid 15, which does not function as an etchant to the element formation layer 11, the peeling layer 12, and the substrate 10.

Pure water can be used for the liquid 15. Resistivity of pure water is greater than or equal to 1 MΩ·cm, which is very high: however, when pure water is in contact with the element formation layer 11 or the peeling layer 12, the pure water is mixed with an impurity, so that electric resistance is decreased. Accordingly, the lower surface of the element formation layer 11 and the upper surface of the peeling layer 12 which appear by peeling are wetted with pure water, so that electric charge generated by peeling can be diffused in the lower surface of the element formation layer 11 and the upper surface of the peeling layer 12. Consequently, even if the surfaces of the element formation layer 11 and the peeling layer 12 are formed of a high-resistance material, electric discharge toward the inside of the element formation layer 11 and the peeling layer 12 can be prevented.

Alternatively, a solution which has lower resistivity than pure water can be used for the liquid 15. That is, a solution in which a substance is dissolved in water as a solvent can be used. The solution may be any of acid, alkaline, and neutral. For example, a solution in which acid or a base is dissolved, a solution in which salt (salt may be any one of acid salt, alkaline salt, and normal salt) is dissolved, or the like can be used. Specifically, as a solution which can be used for the liquid 15, a carbon dioxide ($CO_2$) solution, a hydrogen chloride (HCl) solution (hydrochloric acid), or a tetramethylammonium hydroxide ($NH_4Cl$) solution, or the like is given.

A substance dissolve in water is preferably a molecule substance which becomes a gas at room temperature (25° C.) and atmospheric pressure. For example, carbon dioxide or hydrogen chloride is given. In addition, in the case where the substance is salt, salt which functions as a surfactant is preferably used. A surface can be easily wetted by a surfactant dissolved in water.

Alternatively, a mixture of water and volatile liquid can be used for the liquid 15. A drying step can be omitted by the liquid 15 containing volatile liquid. If water is contained in the volatile liquid at approximately 0.1%, electric charge is diffused by the liquid 15, that is, an antistatic effect can be obtained. Some products of commercial highly pure organic solvents such as ethanol or acetone also contain water as an impurity at greater than or equal to 0.1%, and thus, such a commercial organic solvent can be used as the mixture of water and volatile liquid of the present invention without density control. Moreover, in order to utilize an advantage of the volatile liquid, a concentration of the volatile liquid is preferably greater than or equal to 30%. Accordingly, a lowly pure organic solvent such as denatured ethanol, which has been common as organic liquid, can be used as the mixture of water and volatile liquid of the present invention without density control.

Figure 6:
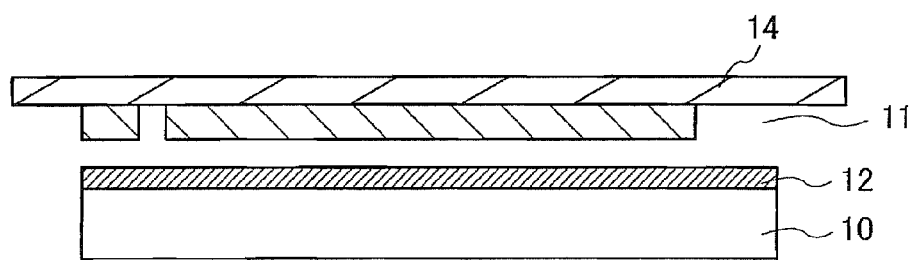
FIG. 6 is a cross-sectional diagram for explaining a manufacturing method of a semiconductor device and a diagram for showing that an element formation layer 11 is separated from a substrate 10.
Figure 7:
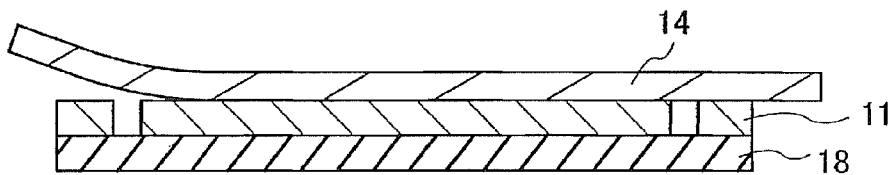
FIG. 7 is a cross-sectional diagram for explaining a manufacturing method of a semiconductor device and a diagram for explaining that a first flexible substrate 18 is fixed to a lower surface of an element formation layer 11 and a supporting material 14 is peeled.

As shown in FIG. 6, when peeling of the element formation layer 11 is completed, the substrate 10 and the peeling layer 12 is separated from the element formation layer 11. As shown in FIG. 7, a first flexible substrate 18 is fixed to the lower surface of the element formation layer 11 with an adhesive agent. Then, the supporting substrate 14 is peeled from the upper surface of the element formation layer 11.

Figure 8:
FIG. 8 is a cross-sectional diagram for explaining a manufacturing method of a semiconductor device and a diagram for explaining that a first flexible substrate 18 is divided.

Next, as shown in FIG. 8, in order to separate the first flexible substrate 18 for each semiconductor device, the first flexible substrate 18 is divided with the element formation layer 11. Laser light irradiation may be employed for the division step.

Figure 9:
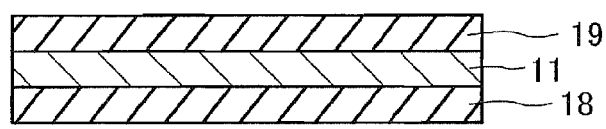
FIG. 9 is a cross-sectional diagram of a semiconductor device manufactured by a manufacturing method of the present invention.

Next, as shown in FIG. 9, a second flexible substrate 19 is fixed to the upper surface of the element formation layer 11. The second flexible substrate 19 may be provided according to need. By the above-described manufacturing method, a flexible semiconductor device including the element formation layer 11 as shown in FIG. 9 can be manufactured.

The first flexible substrate 18 and the second flexible substrate 19 are flexible and can be bent. For example, a plastic substrate made of polycarbonate, polyarylate, polyether sulfone, or the like can be used for the flexible substrates 18 and 19. Alternatively, a film made of an organic compound such as polyethylene terephthalate, polypropylene, polyester, vinyl, polyvinyl fluoride, or polyvinyl chloride can be used.

For fixing the first flexible substrate 18 and the second flexible substrate 19 to the element formation layer 11, an adhesive agent is used, which has adherence by heating or irradiation of visible light or UV light and is hardened after cooling to bond objects. For example, an adhesive agent such as a thermoplastic resin or a photopolymerization resin can be used.

It is to be noted that although the method for manufacturing the semiconductor device in the case where the peeling layer 12 is formed of a metal film or an alloy film is explained as an example, the present invention is not limited to this example. The peeling layer may be formed of a material from which the element formation layer can be peeled by application of mechanical force. In addition, although the case where peeling is generated at the interface between the element formation layer 11 and the peeling layer 12 is explained as an example, a portion where peeling is generated is not limited to this. For example, as the peeling layer 12, an amorphous silicon film containing hydrogen may be formed over the substrate 10 by plasma CVD using silane gas as a raw material. Hydrogen is discharged from the amorphous silicon film by irradiation of UV laser light such as excimer laser light. Accordingly, adherence between the amorphous silicon film and the substrate 10 is decreased. Otherwise, the amorphous silicon film itself becomes fragile, and thus, peeling can be generated at the interface between the peeling layer 12 and the substrate 10 or inside the peeling layer 12.

Moreover, the peeling layer 12 is provided as a multilayer formed of different materials, so that peeling can be generated at an interface of the layers forming the peeling layer. For example, as the peeling layer 12, a tungsten film is formed by sputtering and a silicon dioxide film is formed over the tungsten film by sputtering. When the silicon dioxide film is deposited, oxide of tungsten is generated at an interface between the tungsten film and the silicon dioxide film. Because the bonding at the interface between the tungsten film and the silicon dioxide film is weak, and thus, peeling can be generated between the tungsten film and the silicon dioxide film by application of force to the peeling layer 12.

Figure 11:
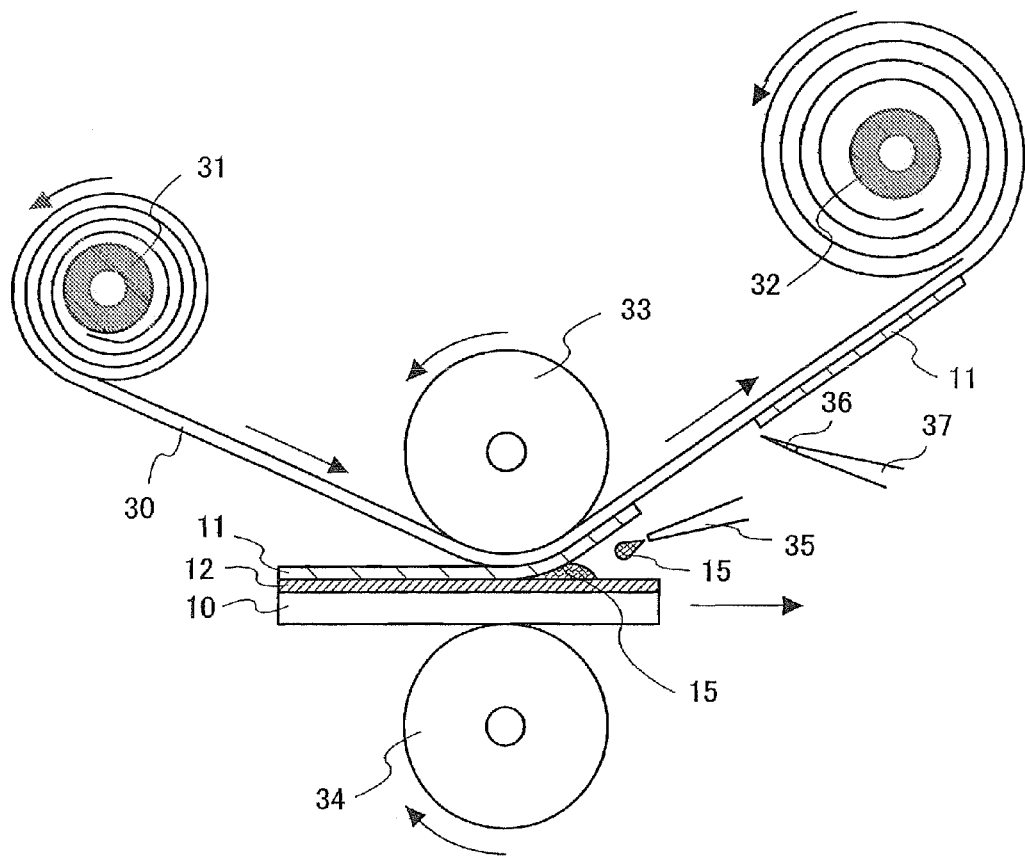
FIG. 11 is a side view for explaining a structural example of a peeling apparatus of the present invention.

A peeling apparatus of the present invention can continuously perform steps from the step of fixing the supporting substrate 14 to the element formation layer 11 as shown in FIG. 3 to the step of separating the element formation layer 11 from the substrate 10 as shown in FIG. 6. Hereinafter, a structural example of the peeling apparatus of the present invention is explained with reference to FIG. 11. FIG. 11 is a side view illustrating a structural example of the peeling apparatus of the present invention. In addition, FIG. 11 also illustrates how an element formation layer is separated from a substrate and transferred (attached) to a supporting substrate. A film 30 in FIG. 11 is a base which corresponds to the supporting substrate 14 of FIG. 11. One surface of the film 30 has an adhesive layer formed of a resin.

The peeling apparatus shown in FIG. 11 includes a supplying roller 31 for supplying the film 30 and a collecting roller 32 for collecting the film 30, to which the element formation layer 11 is transferred, and a pair of pressurization rollers 33 and 34 for applying pressure to the element formation layer 11 and the film 30. Furthermore, the peeling apparatus includes liquid supplying nozzle 35 for supplying the liquid 15 and a drying nozzle 37 for supplying dried air 36.

Since the film 30 and the substrate 10 are sandwiched between the pressurization roller 33 and the pressurization roller 34, the film 30 moves by cooperative rotation of the rollers 31 to 34, so that the film 30 is sent from the supplying roller 31 and reeled by the collecting roller 32. In addition, the film 30 is pulled obliquely upward from the upper surface of the substrate 10 by the collecting roller 32, using a portion applied with pressure by the pressurization rollers 33 and 34 as a supporting point. The substrate 10 is moved by rotation of the pressurization rollers 33 and 34.

Next, usage of the peeling apparatus of FIG. 11 is explained. The substrate 10 over which the element formation layer 11 and the peeling layer 12 are formed and the film 30 are made to go through the gap between the pressurization roller 33 and the pressurization roller 34. The substrate 10 is made to go through so that the side on which the element formation layer 11 is formed faces the pressurization roller 33. As for the film 30, an adhesive layer side is made to face the pressurization roller 34 side. Tension is applied to between both ends of the film 30 by the supplying roller 31 and the collecting roller 32, so that slack is not generated in the film 30.

The pressurization rollers 33 and 34 are rotated so that the substrate 10 is moved. The supplying roller 31 and the collecting roller 32 rotate in accordance with rotation of the pressurization rollers 33 and 34. By rotation of these rollers, the element formation layer 11 is attached to the film 30 between the pressurization rollers 33 and 34.

On sides of the pressurization rollers 33 and 34 where the film 30 is collected, the film 30 is pulled obliquely with respect to the moving direction (horizontal direction) of the substrate 10 so that the film 30 is bent along a curved surface of the pressurization roller 33. When the film 30 is bent, peeling is generated between the element formation layer 11 and the peeling layer 12, and the element formation layer 11 is transferred to the film 30. That is, the rollers 32, 33, and 34 cooperate, the film 30 is transformed and the element formation layer 11 is peeled from the substrate 10.

In the peeling apparatus of FIG. 11, the liquid 15 is dropped from the nozzle 35 on the sides of the pressurization rollers 33 and 34, where the film 30 is collected, so that the liquid 15 is supplied to the edge portion of peeling (the portion 17 surrounded by chained line in FIG. 5). Accordingly, a surface which appears by peeling is wetted with the liquid 15 at the moment when peeling is generated between the element formation layer 11 and the peeling layer 12, and thus, electric charge generated by peeling can be diffused immediately.

The dried air 36 is sprayed from the nozzle 37 to the side where the film 30 is collected rather than a portion where the liquid 15 is supplied so that the element formation layer 11 which is wetted with the liquid 15 is dried. In the case where liquid which does not need the drying treatment, such as a mixture of nonvolatile liquid and water, is used for the liquid 15, the drying treatment by the nozzle 37 is not needed.

Figure 12:
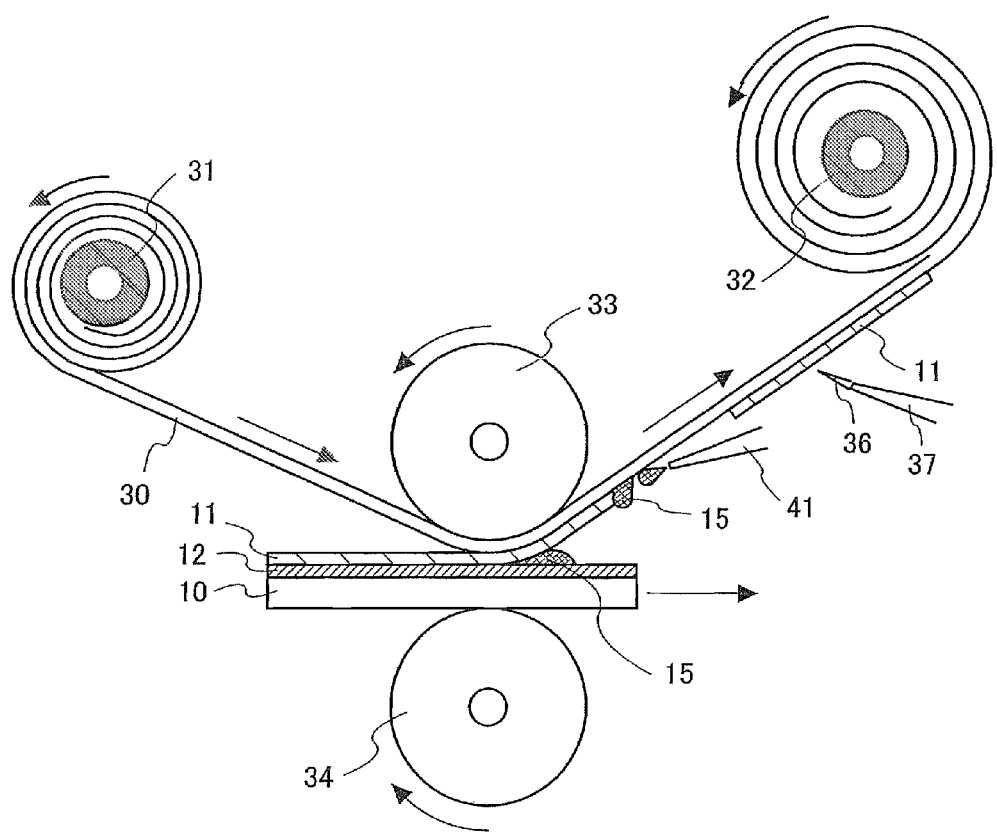
FIG. 12 is a side view for explaining a structural example of a peeling apparatus of the present invention.

Although the liquid 15 is dropped toward the gap between the peeling layer 12 and the element formation layer 11 in the peeling apparatus of FIG. 11, a position onto which the liquid 15 is dropped can be changed. FIG. 12 illustrates a peeling apparatus in which a position onto which the liquid 15 is supplied differs from that in FIG. 11.

A nozzle 41 is a liquid supplying nozzle for supplying the liquid 15. In the peeling apparatus of FIG. 12, the liquid 15 is dropped on the side closer to the position where the film 30 is collected than in FIG. 11. The dropped liquid 15 is supplied to the gap between the element formation layer 11 and the peeling layer 12 through the film 30 and the element formation layer 11.

Figure 13:
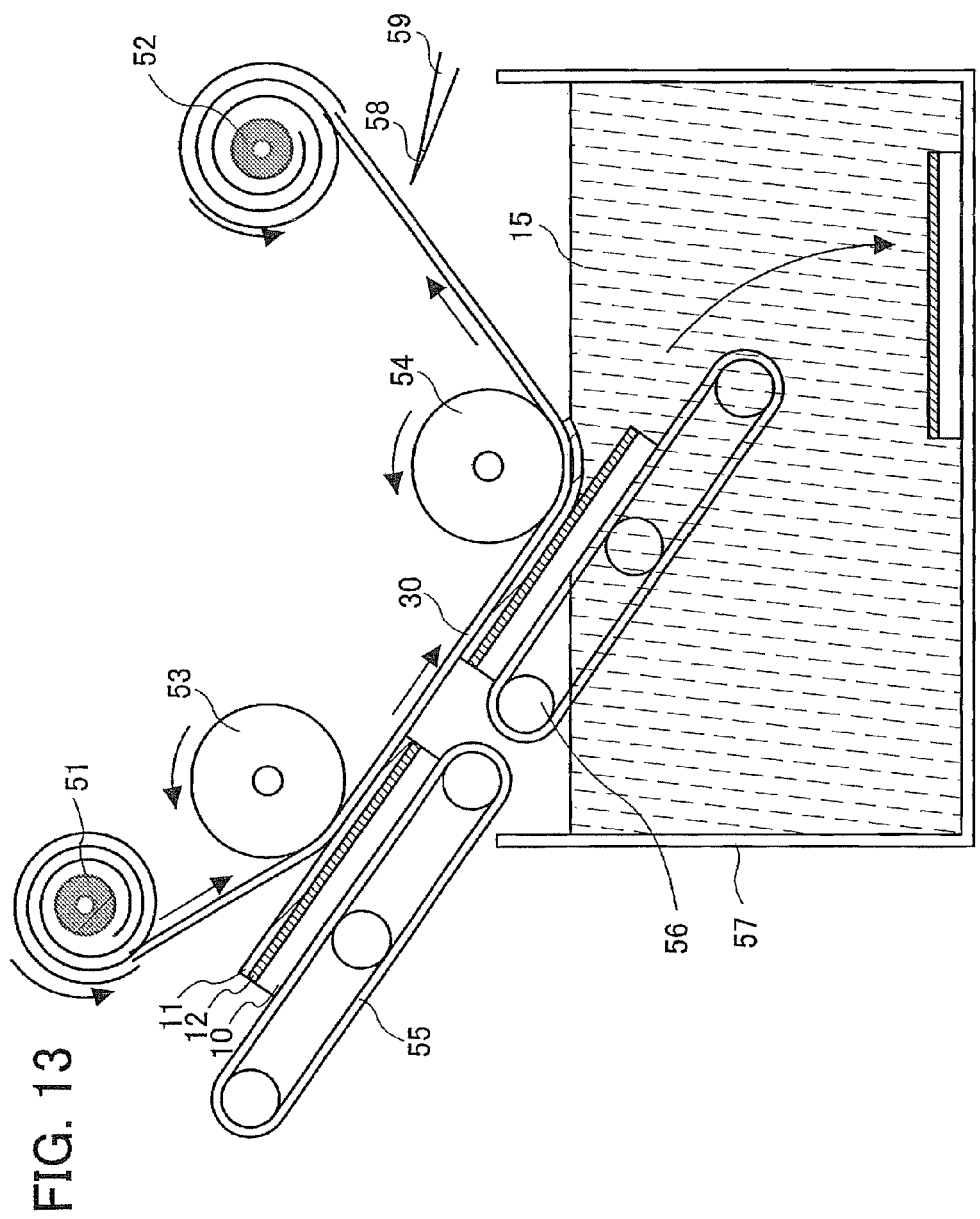
FIG. 13 is a side view for explaining a structural example of a peeling apparatus of the present invention.

Each of FIGS. 11 and 12 illustrates a structural example of the peeling apparatus including a unit of dropping liquid. FIG. 13 illustrates another structural example of a peeling apparatus. The peeling apparatus of FIG. 13 includes a tank for liquid as a liquid supplying unit. Hereinafter, a structure of the peeling apparatus is explained with reference to FIG. 13.

The peeling apparatus shown in FIG. 13 includes a supplying roller 51 for supplying the film 30, a collecting roller 52 for collecting the film 30, to which the element formation layer 11 is transferred, pressurization rollers 53 and 54 for applying pressure to the element formation layer 11 and the film 30, and belt conveyors 55 and 56 for moving the substrate 10. Furthermore, the peeling apparatus includes a tank 57 for the liquid 15 and a drying nozzle 59 for spraying dried air 58.

The pressurization roller 53 and the belt conveyor 55 face with each other with a predetermined gap therebetween. The pressurization roller 53 and the belt conveyor 55 are mechanism for attaching the film 30 to the element formation layer 11 and provided outside the tank 57.

The pressurization roller 54 and the belt conveyor 56 face each other with a predetermined gap therebetween. The element formation layer 11 is peeled from the substrate 10 between the pressurization roller 54 and the belt conveyor 56. The belt conveyor 56 is inside the tank 57 so that a portion of the element formation layer 11 where peeling is generated is inside the tank 57. The film 30 is pulled obliquely upward from an upper surface of the substrate 10 by the collecting roller 52, using a portion applied with pressure by the pressurization roller 54 as a supporting point. A moving direction of the film 30 and a direction of tension to the film 30 are parallel between the pressurization roller 53 and the pressurization roller 54 so that the film 30 is not transformed.

In addition, the supplying roller 51, the collecting roller 52, and the pressurization rollers 53 and 54 are units of moving the film 30. By cooperative rotation of these rollers, the film 30 is sent from the supplying roller 51 and reeled by the collecting roller 52. The substrate 10 is moved by rotation of the belt conveyors 55 and 56.

Next, usage of the peeling apparatus of FIG. 13 is explained. The substrate 10 on which the element formation layer 11 and the peeling layer 12 are formed and the film 30 are made to go through the gap between the pressurization roller 53 and the belt conveyor 55 and between the pressurization roller 54 and the belt conveyor 56. The substrate 10 is made to go through so that the side on which the element formation layer 11 is formed faces the pressurization rollers 53 and 54. As for the film 30, an adhesive layer side is made to face the belt conveyors 55 and 56. Tension is applied between both ends of the film 30 by the supplying roller 51 and the collecting roller 52, so that slack is not generated in the film 30.

The belt conveyors 55 and 56, the supplying roller 51, and the collecting roller 52 rotate in accordance with rotation of the pressurization rollers 53 and 54, so that the film 30 is moved with the substrate 10. The film 30 is attached to the element formation layer 11 between the pressurization roller 53 and the belt conveyor 55.

Furthermore, the substrate 10 is moved with the film 30 and sent to the gap between the pressurization roller 54 and the belt conveyor 56. On sides of the pressurization roller 54 and the belt conveyor 56, where the film 30 is collected, the film 30 is pulled obliquely with respect to a moving direction of the substrate 10, so that the film 30 is bent along a curved surface of the pressurization roller 54. When the film 30 is bent, peeling is generated between the element formation layer 11 and the peeling layer 12, and the element formation layer 11 is transferred to the film 30. That is, the collecting roller 52, the pressurization roller 54, and the belt conveyor 56 cooperate, the film 30 is transformed and the element formation layer 11 is peeled from the substrate 10. The substrate 10 is dropped into the tank 57 after passing through the pressurization roller 54 and the belt conveyor 56.

In the peeling apparatus of FIG. 13, the portion where peeling of the element formation layer 11 is generated is inside the liquid 15 in the tank 57. Accordingly, a surface which appears by peeling is wetted with the liquid 15 at the moment of generation of peeling of the element formation layer 11 and the peeling layer 12, and thus, electric charge generated by peeling can be diffused immediately.

Lastly, the dried air 58 is sprayed from the nozzle 59 to the film 30 to which the element formation layer 11 is transferred, so that the element formation layer 11 is dried. In the case where liquid which does not need to be dried such as a mixture of nonvolatile liquid and water is used for the liquid 15, drying treatment by the nozzle 59 is not needed.

It is to be noted that, in the peeling apparatuses of FIGS. 11 and 12, the pressurization roller 34 can be replaced with a belt conveyor. In addition, in the peeling apparatus of FIG. 13, one or both of the belt conveyors 55 and 56 can be replaced with a pressurization roller.

Embodiment 1

In this embodiment, a method for manufacturing a semiconductor device capable of noncontact inputting and outputting of data with the use of a peeling apparatus of the present invention will be explained. In this embodiment, an integrated circuit capable of wireless communication with 13.56 MHz signals and functioning as an IC tag is formed in an element formation layer. Hereinafter, this embodiment will be explained with reference to FIGS. 1 to 10 and FIGS. 14 to 17.

As shown in FIG. 1, a peeling layer 12 is formed over a substrate 10 and an integrated circuit is formed over the peeling layer 12. Hereinafter, a method for manufacturing the peeling layer 12 and an element formation layer 11 will be explained with reference to FIGS. 14 to 17.

Figure 14:
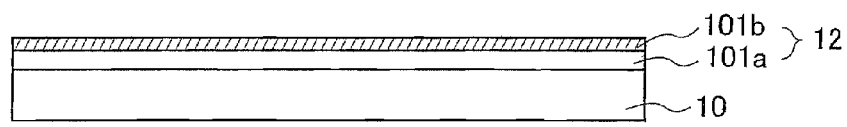
FIG. 14 is a cross-sectional diagram for explaining a formation method of a peeling layer of Embodiment 1.

As the substrate 10, a glass substrate (thickness: 0.7 mm, product name: AN100) made by Asahi Glass Co., Ltd. which is cut to have 5 inch on each side is used. As shown in FIG. 14, the peeling layer 12 had a multilayer structure of a silicon oxynitride ($SiO_xN_y$, x>y) layer 101a and a tungsten layer 101b. The silicon oxynitride layer 101a is formed to have a thickness of 200 nm, using $SiH_4$ and $N_2O$ as source gases with a parallel plate plasma CVD apparatus. The tungsten layer 101b is formed to have a thickness of 50 nm using a tungsten target with a sputtering apparatus. $N_2O$ plasma is generated and a surface of the tungsten layer 101b is subjected to plasma treatment to be oxidized, so that tungsten oxide is formed. By this plasma treatment, peeling comes to be generated in the tungsten oxide, which is an interface between the peeling layer 12 and the element formation layer 11. In addition, when the tungsten layer 101b is formed by sputtering, the silicon oxynitride layer 101a which is a lower layer of the peeling layer 12 is a barrier layer for preventing an impurity from diffusion from the substrate 10 such as a glass substrate. An insulating film formed of another inorganic material such as silicon oxide or silicon nitride can be used for the barrier layer.

Figure 15:
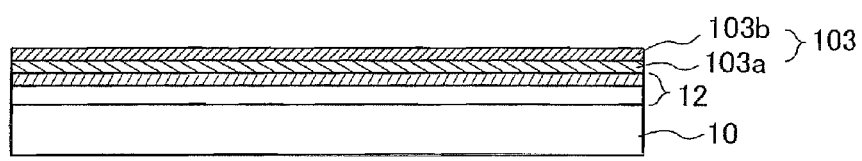
FIG. 15 is a cross-sectional diagram for explaining a formation method of an element formation layer of Embodiment 1 and a diagram for explaining that an insulating film 103 of the element formation layer is formed over a peeling layer 12.

As shown in FIG. 15, an insulating layer 103 which serves as a base insulating layer of a semiconductor element such as a TFT of the element formation layer 11 is formed over the peeling layer 12. The insulating layer 103 has a stacked structure of a silicon oxynitride ($SiO_xN_y$, x<y) layer 103a and a silicon oxynitride ($SiO_xN_y$, x>y layer 103b. The first silicon oxynitride layer 103a is formed using $SiH_4$, $N_2O$, $NH_3$, and $H_2$ as source gases with a parallel plate plasma CVD apparatus. The second silicon oxynitride layer 103b is formed using $SiH_4$ and $N_2O$ as source gases with a parallel plate plasma CVD apparatus.

Figure 16:
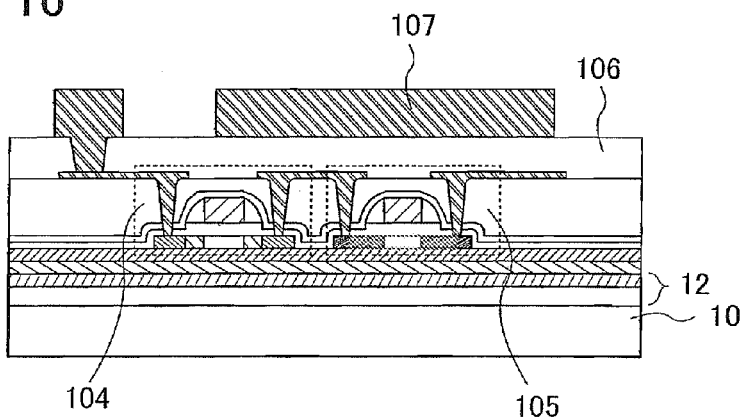
FIG. 16 is a cross-sectional diagram for explaining a formation method of an element formation layer of Embodiment 1 and a diagram for explaining that an integrated circuit including a thin film transistor is formed over an insulating film.

As shown in FIG. 16, over the insulating layer 103, an integrated circuit is formed of a semiconductor element such as a TFT and a capacitor. In FIG. 16, as a cross-sectional diagram of the integrated circuit, a CMOS circuit formed of an n-channel TFT 104 and a p-channel TFT 105 is shown. It is to be noted that 48 (8 rows×6 columns) integrated circuits are formed to be arranged in matrix over one substrate 10 at the same time.

For wireless communication, an antenna 107 which is connected to the integrated circuit (TFTs 104 and 105) is formed. First, before the antenna 107 is formed, an insulating film 106 is formed covering the integrated circuit (TFTs 104 and 105). In this embodiment, the insulating film 106 is formed of photosensitive polyimide, and an opening for connecting the antenna 107 is formed in the insulating film 106.

Over the insulating film 106, a silver (Ag) paste is formed into a desired shape by printing to prepare the antenna 107. It is to be noted that half of the 48 integrated circuits over the same substrate 10 are provided with the antenna 107, and a stacked structure of the integrated circuit and the antenna is formed. In addition, the other half of them are provided with a bump for connecting the integrated circuit with an external antenna with the use of silver paste, instead of the antenna 107. It is to be noted that the antenna 107 or the bump can be formed in such a manner that a conductive film such as aluminum is formed by sputtering and processed into a desired shape by etching.

Figure 17:
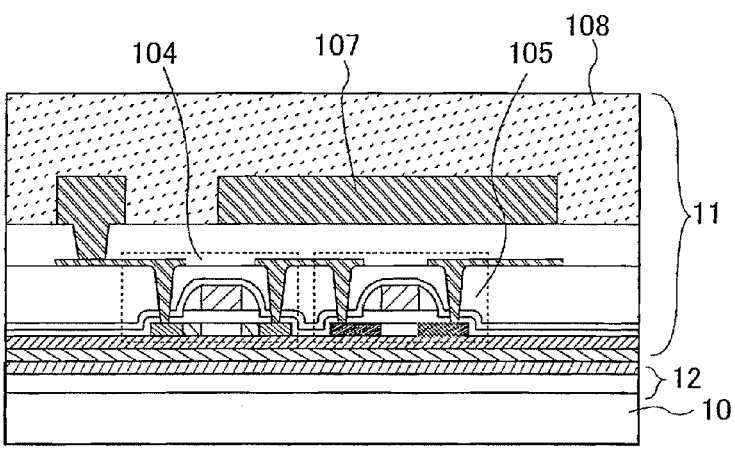
FIG. 17 is a cross-sectional diagram for explaining a formation method of an element formation layer of Embodiment 1 and a cross-sectional diagram of the element formation layer.

Lastly, as shown in FIG. 17, a resin layer 108 for sealing is formed covering the antenna 106. An epoxy resin layer with a thickness of 30 μm is formed as the resin layer 108. Accordingly, a structure including the peeling layer 12 and the element formation layer 11 is formed over the substrate 10.

A plurality of integrated circuits is formed in the element formation layer 11 over the substrate 10. As shown in FIG. 2, grooves 13 are formed in the element formation layer 11 in advance so that the integrated circuits can be separated from one another when the element formation layer 11 is separated from the substrate 10. The grooves 13 are formed so as to surround a circumference of each integrated circuit in the element formation layer 11. In this embodiment, the grooves 13 are formed by irradiation of UV laser light with the wavelength of 266 nm and the output of 2 W. By formation of the grooves 13 in the element formation layer 11, peeling is slightly generated at the interface between the element formation layer 11 and the peeling layer 12 which are exposed by the grooves 13, which leads to a state in which the element formation layer 11 floats along the grooves 13.

Next, a series of steps shown in FIGS. 3 to 6 are performed with an apparatus of FIG. 11. A PET (Poly-Ethylene-Terephthalate) film in which one surface is provided with an adhesive layer is used as a film 30. The PET film has the thickness of 0.1 mm (excluding the adhesive layer) and the adhesion of 0.39 N/25 mm. Pure water in which $CO_2$ is dissolved (hereinafter, referred to as "$CO_2$ water") is used as liquid 15. Resistivity of the $CO_2$ water is 0.2 MΩ·cm.

A pressurization roller 33 and a pressurization roller 34 are positioned with the space of 0.8 to 0.9 mm therebetween. The pressurization roller 33 and the pressurization roller 34 are rotated so that movement speed of the film 30 and the substrate 10 are 200 mm/min. In addition, in this embodiment, dried air is sprayed from the nozzle 37 and the element formation layer 11 transferred to the film 30 is dried.

With the peeling apparatus of FIG. 11, the element formation layer 11 is peeled from the substrate 10 while discharging the $CO_2$ water from a nozzle 35. The $CO_2$ water enters the gap between the element formation layer 11 and the peeling layer 12, and at the moment of generation of peeling, the element formation layer 11 and the peeling layer 12 can be wetted.

The element formation layer 11 was observed in a state in which the element formation layer 11 was bonded to the film 30 (a state shown in FIG. 6) with an optical microscope to check whether electric power breakdown due to electric discharge (breakdown in which a semiconductor layer, an insulating film, a conductive film, or the like is melted due to heat generated by electric discharge) was generated. An object of the observation with the optical microscope is to check whether a visible damage is not generated in the semiconductor element. In this embodiment, all 48 integrated circuits formed over one substrate 10 were observed with the optical microscope.

Comparative examples will be described below in which electricity was removed by an ionizer instead of supplying the liquid 15 when peeling was performed with the apparatus of FIG. 11. An air ionizer was used in Comparative Example 1, whereas a soft X-ray ionizer was used in Comparative Example 2. The performance of these ionizers is such that the time it takes to reduce the amount of electricity of a charged object located 15 cm away from ±5000 V to less than or equal to ±100 V is less than 1 second. In addition, as Comparative Example 3, another example will be described, in which the element formation layer 11 was peeled with the peeling apparatus of FIG. 11 without supplying liquid or using an ionizer.

According to the observation result with the optical microscope, electric power breakdown was not generated in the integrated circuit in the element formation layer which was peeled by supply of the liquid ($CO_2$ water). On the other hand, there was an integrated circuit in which power breakdown was generated in the case where the element formation layer 11 was separated from the substrate 10 without supply of the liquid 15.

TABLE 1

Observation results with optical microscope

| | Liquid | Ionizer | Number of observed substrates | Total number of observed integrated circuits | Total number of destroyed integrated circuits | Ratio of destroyed integrated circuits |
|---|---|---|---|---|---|---|
| Embodiment 1 | $CO_2$ water | — | 2 | 96 | 0 | 0.0% |
| Comparative Example 1 | — | Blower type | 2 | 96 | 95 | 99.0% |
| Comparative Example 2 | — | Soft X-ray type | 2 | 96 | 85 | 88.5% |
| Comparative Example 3 | — | — | 2 | 96 | 95 | 99.0% |

Table 1 summarizes observation results with the optical microscope. As shown in Table 1, out of the integrated circuits manufactured with the substrates to which a measure against static electricity was not performed (Comparative Example 3) or the substrates in which electricity was removed with an air blower ionizer (Comparative Example 1), power breakdown occurred in all but 1%. In addition, out of the integrated circuits manufactured with the substrates in which electricity was removed with the soft X-ray ionizer (Comparative Example 2), power breakdown occurred in all but about 12%. From Comparative Examples 1 to 3, it was found that, by the supply of liquid as in Embodiment 1, the generation of power breakdown can be prevented.

Figure 10:
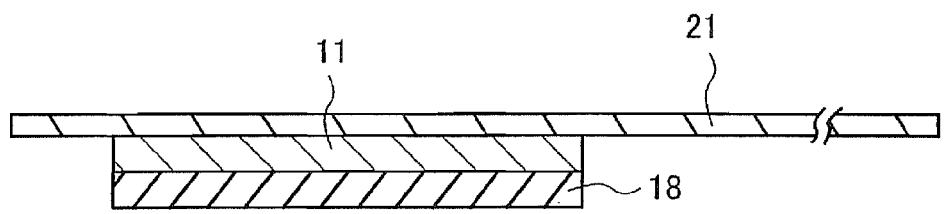
FIG. 10 is a cross-sectional diagram of a semiconductor device manufactured by a manufacturing method of the present invention.

After the state of FIG. 6 is obtained, a semiconductor device including the element formation layer 11 sealed with a first flexible substrate 18 and a second flexible substrate 19 is manufactured as shown in FIG. 9 by the series of steps explained with reference to FIGS. 7 to 9. It is to be noted that, instead of the second flexible substrate 19, a film 21 in which an antenna is formed is fixed to the element formation layer 11 including a circuit which is not connected to an antenna among the integrated circuits as shown in FIG. 10, so that a semiconductor device is manufactured. An anisotropic conductive adhesive is used to attach the film 21 with the element formation layer 11, and a terminal of the antenna on the film 21 is electrically connected to the bump of the integrated circuit.

The semiconductor devices shown in FIGS. 9 and 10 can be used as an inlet (also referred to as an inlay) incorporated in a non-contact IC tag or the like. It is to be noted that the semiconductor device of the present invention refers not only to an intermediate product such as an inlet, but also to an end product such as an IC card, an ID label, or IC tag in which an inlet as shown in FIGS. 9 and 10 is incorporated in a plastic card, attached to a sticker label, or embedded in paper.

Signals were wirelessly inputted to the semiconductor devices shown in FIGS. 9 and 10 which had been completed through the manufacturing method of this embodiment to examine whether a predetermined operation was performed. It was confirmed that all semiconductor devices which were observed with the optical microscope (semiconductor devices including the integrated circuits which were observed with the optical microscope) were operated. In consideration of the observation results with the optical microscope in Table 1, it is thought that static electricity generated by peeling was able to be prevented from being discharged when the element formation layer was separated from the substrate while supplying liquid. That is, according to this embodiment of the present invention, it was found that destruction of the semiconductor element included in the semiconductor device and characteristic deterioration of the semiconductor element due to electric charge generated by peeling can be prevented.

It is to be noted that, in the structure of this embodiment, although the lower surface of the element formation layer 11 which appears by peeling is formed of tungsten oxide or silicon oxynitride, which is a high-resistance material, an integrated circuit can be prevented from being destroyed due to peeling discharge by application of this embodiment. That is, if the peeling apparatus of the present invention is used, the lower surface of the element formation layer 11 can be formed of an insulating material without limitation to a conductive material. That is, with the peeling apparatus of the present invention, electric charge generated by peeling can be prevented from being discharged into either of two separated layers; thus, even when the lower surface of the element formation layer is formed of an insulating material, destruction of the semiconductor element included in the element formation layer due to static electricity generated by peeling and characteristic deterioration of the semiconductor element can be prevented.

Embodiment 2

In this embodiment, a structural example of a semiconductor device including an integrated circuit capable of wireless communication with an antenna will be explained with reference to FIGS. 18A to 18D.

Figure 18A:
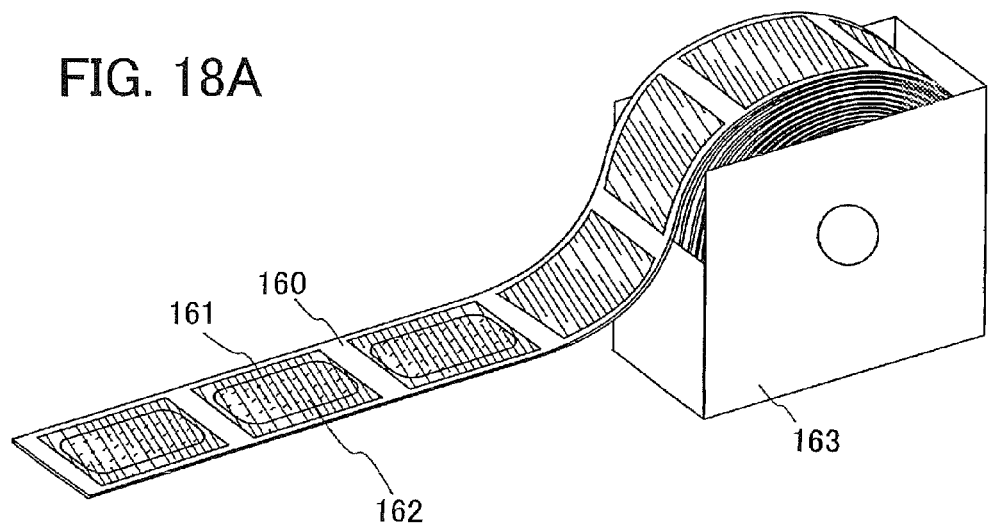
FIGS. 18A to 18D are diagrams illustrating structural examples of a semiconductor device including an integrated circuit capable of wireless communication with an antenna.

FIG. 18A illustrates a structural example of an ID label as a semiconductor device of the present invention. A plurality of ID labels 161 is formed on a label board 160 (separate sheet). Each ID label 161 contains an inlet (also referred to as an inlay) 162 including an antenna and an integrated circuit which are capable of wireless communication. The ID labels 161 are put in a box 163. Information on the product and service (e.g., a product name, a brand name, a trademark, an owner of the trademark, a seller, a manufacturer, or the like) are written on the ID labels 161. On the other hand, an ID number which is peculiar to the product (or a type of the product) is stored in the integrated circuit incorporated in the inlet 162. Information which cannot be written on a surface of the ID label 161, such as an production area, a selling area, quality, a raw material, efficacy, a use application, quantity, a shape, price, a production method, a usage, a production time, a usage time, an expiration date, an instruction of the product, or information on intellectual properties of the product can be stored in the integrated circuit of the inlet 162.

Figure 18B:
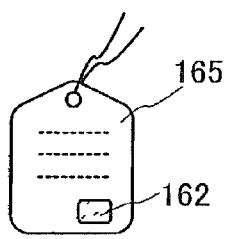

FIG. 18B illustrates a structural example of an ID tag 165. In the ID tag 165, the inlet 162 is incorporated in a paper tag or a plastic tag. When the ID tag 165 capable of wireless communication is provided for a product, product management becomes easy. For example, when a product is stolen, the pathway of the product is traced, so that the criminal can be quickly identified. As described above, by being provided with the ID tag, products that are superior in so-called traceability can be distributed.

Figure 18C:
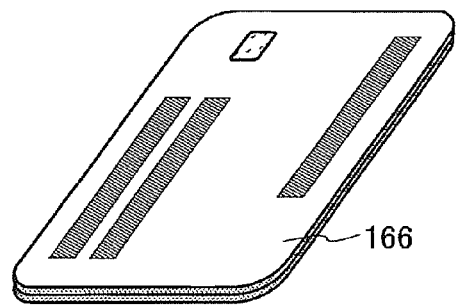

FIG. 18C illustrates a structural example of an ID card 166. The ID card 166 has a structure in which the inlet 162 (not shown) is interposed between two plastic cards. As such an ID card 166, any of cards such as a cash card, a credit card, a prepaid card, an electronic ticket, electronic money, a telephone card, and a membership card are given as examples.

Figure 18D:
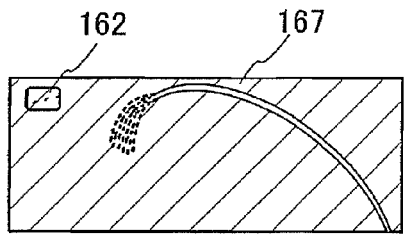

FIG. 18D illustrates a structural example of a semiconductor device in which paper contains an integrated circuit and an example in which the present invention is used for a bearer bond 167. The inlet 162 is embedded in the bearer bond 167. It is to be noted that although a stamp, tickets such as a platform ticket and an admission ticket, a gift certificate, a book coupon, a stationary coupon, a beer coupon, a rice coupon, various kinds of gift coupons, various kinds of service tickets, and the like are included in the bearer bond 167, needless to say, the present invention is not limited to these.

Embodiment 3

Figure 19A:
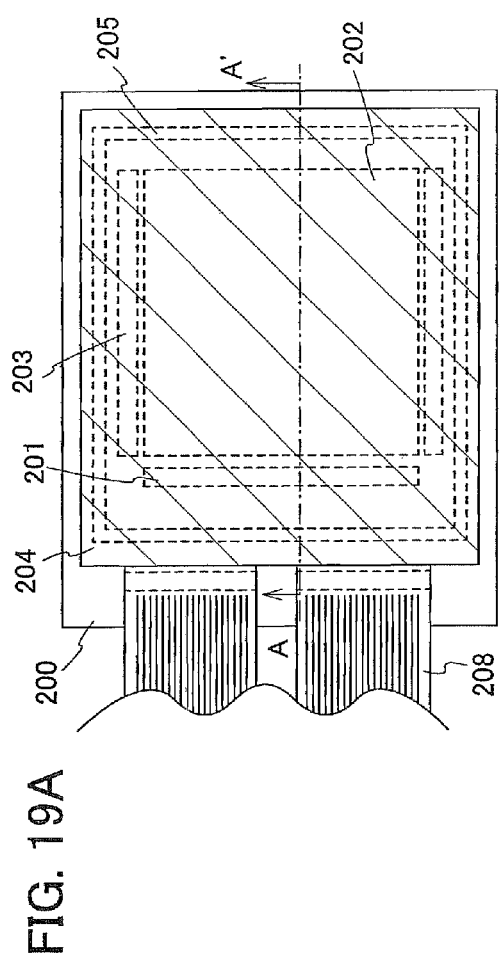
FIGS. 19A and 19B are diagrams illustrating structural examples of a semiconductor device of the present invention.
Figure 19B:
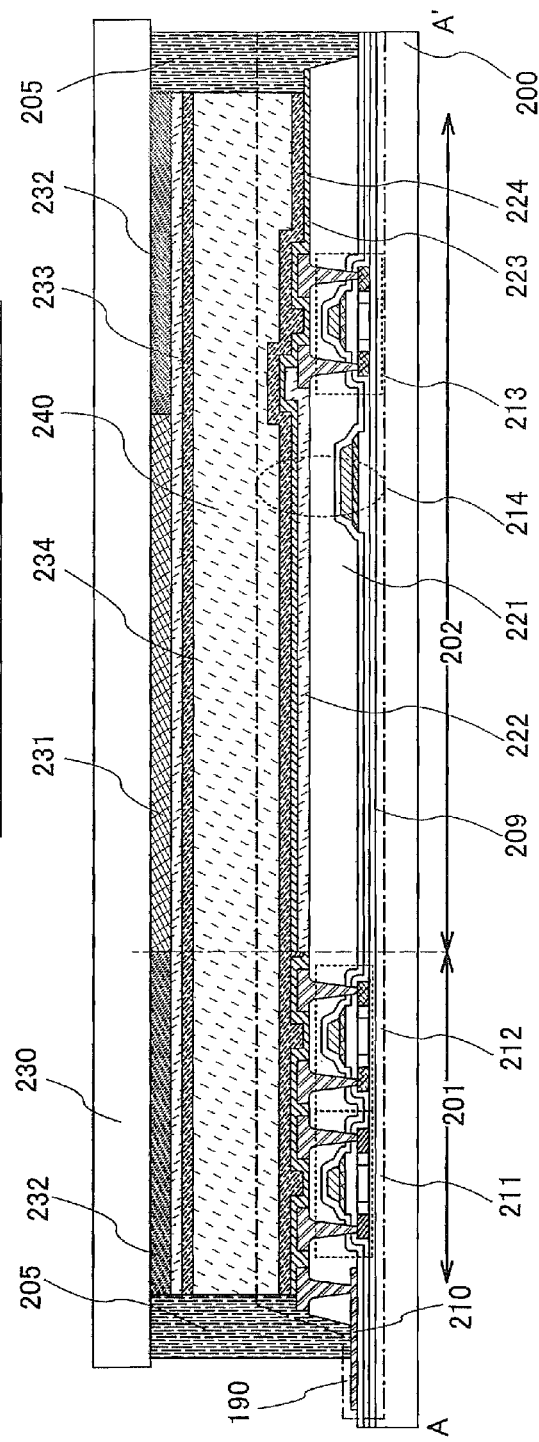

In this embodiment, a structural example of an active matrix liquid crystal module as a semiconductor device of the present invention will be explained with reference to FIGS. 19A and 19B. FIG. 19A is a front view of a liquid crystal module, and FIG. 19B is a cross-sectional diagram cut along a line A-A' of FIG. 19A.

Reference numeral 200 denotes a first flexible substrate; 201 shown by a dotted line denotes a signal line driver circuit; 202 denotes a pixel portion; and 203 denotes a scanning line driver circuit. Over the first flexible substrate 200, the pixel portion 202 formed of a thin film transistor or the like, the signal line driver circuit 201, and the scanning line driver circuit 203 are formed in an element formation layer 190. The element formation layer 190 is fixed to the first flexible substrate 200 with an adhesive agent, so that a substrate for the liquid crystal module is formed. The substrate for the liquid crystal module is manufactured by any of the method and the peeling apparatus explained in above-described Embodiment Mode and Embodiment 1.

Next, a cross-sectional structure of the element formation layer 190 is explained with reference to FIG. 19B. In the element formation layer 190, a semiconductor element is formed over a base film 209 formed of an insulating film. The signal line driver circuit 201 includes a CMOS circuit formed in a combination of an n-channel thin film transistor 211 and a p-channel thin film transistor 212. The pixel portion 202 includes a switching thin film transistor 213 and a capacitor 214. The switching thin film transistor 213 is covered with an interlayer insulating film 221. A pixel electrode 222 is formed over the interlayer insulating film 221. The pixel electrode 222 is electrically connected to the switching thin film transistor 213.

A protective film 223 is formed so as to cover a wiring of the switching thin film transistor 213, the pixel electrode 222, wirings of the n-channel thin film transistor 211 and the p-channel thin film transistor 212. By the protective film 223, an impurity can be prevented from entering an active layer, the interlayer insulating film 221, and the like of the thin film transistor. An orientation film 224 is formed over the protective film 223. It is to be noted that the orientation film 224 is formed according to need.

A wiring 210 in the element formation layer 190 is a wiring for transmitting a signal or the like to be inputted to the signal line driver circuit 201 and the scanning line driver circuit 203, and is connected to an FPC (Flexible Printed Circuit) 208 which serves as an external input terminal. It is to be noted that the liquid crystal module of the present invention includes both of a mode in which only the FPC 208 is provided and a mode in which both the FPC 208 and a PWB are provided.

The liquid crystal module of this embodiment includes the substrate for the liquid crystal module including the first flexible substrate 200 and the element formation layer 190, the counter substrate using a second flexible substrate 230, a sealant 205, a liquid crystal 240, and the FPC (Flexible Printed Circuit) 208. The liquid crystal module of this embodiment can be bent.

The counter substrate is provided with a color filter 231, black matrixes (BMs) 232, a counter electrode 233, and an orientation film 234 are formed on the second flexible substrate 230. The color filter 231 can be provided on a first flexible substrate 200 side as well. In addition, the counter electrode 233 is provided for the element formation layer 190 of the first flexible substrate 200, so that a liquid crystal module of an IPS system can be formed.

The second flexible substrate 230 is fixed to the first flexible substrate 200 with the sealant 205, facing the first flexible substrate 200, and the liquid crystal 240 is injected between the first flexible substrate 200 and the second flexible substrate 230 to be sealed with the sealant 205.

Although, in this embodiment, the example in which the signal line driver circuit 201 and the scanning line driver circuit 203 are formed in the element formation layer 190 is described, only the pixel portion 202 can be formed in the element formation layer 190, and the signal line driver circuit 201 and the scanning line driver circuit 203 which are formed of an IC chip using a silicon wafer can be electrically connected to the pixel portion 202 on the first flexible substrate 200 by COG or TAB.

Embodiment 4

Figure 20A:
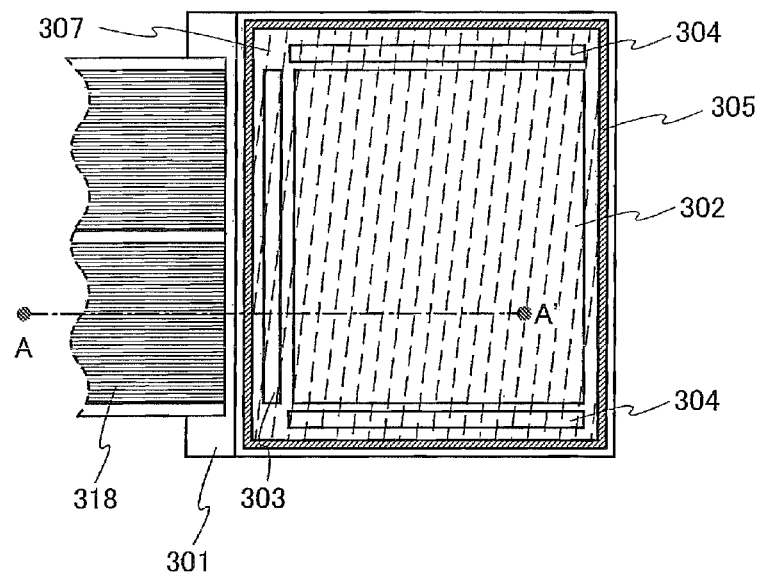
FIGS. 20A and 20B are diagrams illustrating structural examples of a semiconductor device of the present invention.

In this embodiment, as a semiconductor device of the present invention, a structural example of an active matrix EL module will be explained with reference to FIGS. 20A and 20B. FIG. 20A is a front view of an EL module, and FIG. 20B is a cross-sectional view cut along a line A-A' of FIG. 20A.

Figure 20B:
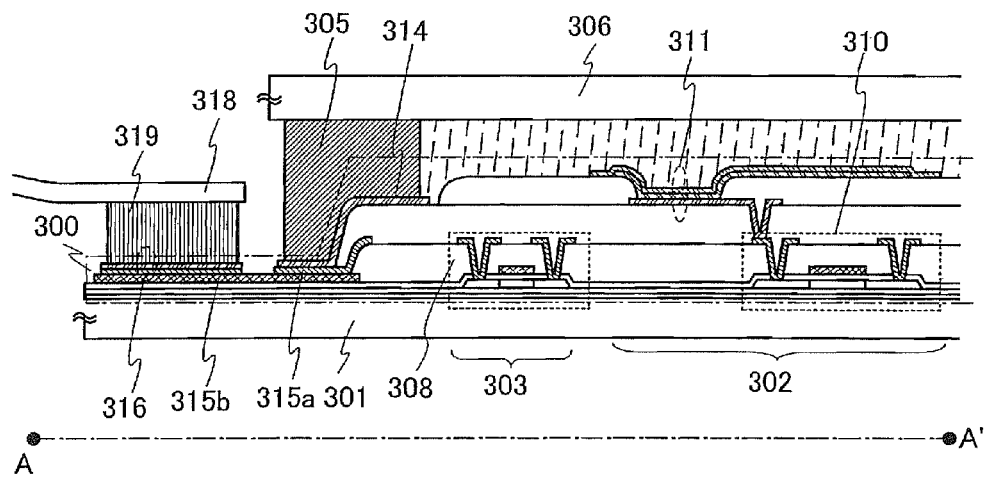

The EL module shown in FIGS. 20A and 20B can be bent, and has a structure in which a transistor and a light-emitting element which are formed in an element formation layer are sealed with a sealant 305 formed between a first flexible substrate 301 and a second flexible substrate 306.

Over the first flexible substrate 301, an element formation layer 300 including a pixel portion 302, a signal line driver circuit 303, and a scanning line driver circuit 304 is fixed with an adhesive agent, and a substrate for an EL module is formed. The substrate for the EL module is formed by any of the method and the peeling apparatus explained in above-described Embodiment Mode and Embodiment 1.

The substrate for the EL module is sealed with the sealant 305 and the second flexible substrate 306, so that the EL module is formed. In the EL module of this embodiment, a space sealed with the substrate for the EL module, the sealant 305, and the second flexible substrate 306 is filled with a filler 307. As the filler 307, an ultraviolet curable resin, a thermosetting resin, polyvinyl chloride, acrylic, polyimide, an epoxy resin, a silicone resin, polyvinyl butyral, or ethylene vinylene acetate can be used, in addition to an inert gas such as nitrogen or argon.

A structure of the element formation layer 300 is hereinafter explained. The pixel portion 302, the signal line driver circuit 303, and the scanning line driver circuit 304 each include a plurality of thin film transistors. FIG. 20B shows only a thin film transistor 308 included in the signal line driver circuit 303 and a thin film transistor 310 included in the pixel portion 302. The pixel portion 302 includes a light-emitting element 311, and the light-emitting element 311 is electrically connected to the thin film transistor 310.

A lead wiring 314 is a wiring for supplying a signal or power supply voltage to a circuit in the element formation layer 300 from outside. The lead wiring 314 is connected to a connection terminal 316 of a two-layer structure through a lead wiring 315a and a lead wiring 315b. The connection terminal 316 is electrically connected to a terminal included in a flexible printed circuit (FPC) 318 through an anisotropic conductive film 319.

Embodiment 5

A semiconductor device of the present invention includes electronic appliances provided with the liquid crystal module described in Embodiment 3 or the EL module of Embodiment 4 in a display portion. Hereinafter, a liquid crystal module and an EL module are collectively referred to as a "display module". As such an electronic appliance, there are a monitor for a computer, a television set (also simply referred to as a television or a television receiver), a camera such as a digital camera or a digital video camera, a mobile phone set (also simply referred to as a cellular phone set or a cellular phone), a portable information terminal such as a PDA (Personal Digital Assistant), a notebook computer, a car audio system, a navigation system, a digital music player, a portable DVD reproducing device, a portable game machine, an arcade game machine, and the like. The specific examples will be explained with reference to FIGS. 21A to 21C.

Figure 21A:
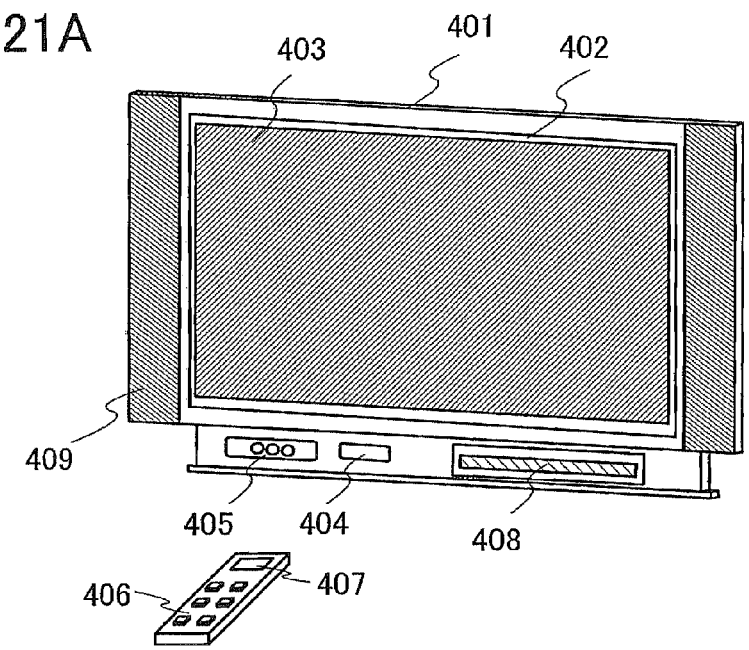
FIGS. 21A to 21C are diagrams illustrating structural examples of a semiconductor device of the present invention.
Figure 21B:
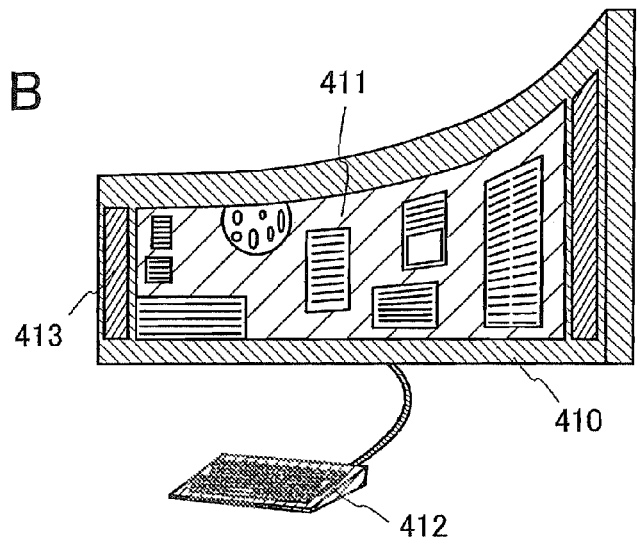

FIGS. 21A and 21B show television devices. As a structure of an incorporated display module, there are the following structures: a structure in which only a pixel portion is formed in an element formation layer, and a scanning line driver circuit and a signal line driver circuit are mounted on a substrate; a structure in which a pixel portion and a scanning line driver circuit are formed in an element formation layer and a signal line driver circuit as a driver IC is mounted on a substrate; a structure in which a pixel portion, a signal line driver circuit, and a scanning line driver circuit are formed in an element formation layer; and the like. The display module of the present invention can have any of the structures. It is to be noted that a scanning line driver circuit and a signal line driver circuit may be mounted on a substrate by a mounting method such as a TAB method or a COG method.

In the television device, as an external circuit other than a display module, a video signal amplifier circuit which amplifies a video signal of signals received by a tuner, a video signal processing circuit which converts the signals outputted from the video signal amplifier circuit into chrominance signals corresponding to respective colors of red, green, and blue, a control circuit which converts the video signal into an input specification of the driver IC, and the like are provided on an input side of the video signal. The control circuit outputs signals to both a scanning line side and a signal line side. In the case of digital drive, a signal dividing circuit can be provided on the signal line side and an input digital signal may be divided into a plurality of numbers and supplied.

Of signals received by the tuner, an audio signal is sent to an audio signal amplifier circuit and an output thereof is supplied to a speaker through an audio signal processing circuit. A control circuit receives control information of a receiving station (reception frequency) or sound volume from an input portion and transmits signals to the tuner and the audio signal processing circuit.

As shown in FIGS. 21A and 21B, in the television device, a display module is incorporated into a chassis. A main screen 403 is formed using the display module, and a speaker portion 409, an operation switch, and the like are provided as its accessory equipment. Thus, a television device can be completed.

As shown in FIG. 21A, a liquid crystal module 402 is incorporated in a chassis 401. General TV broadcast can be received by a receiver 405. When the display device is connected to a communication network by wired or wireless connections via a modem 404, one-way (from a sender to a receiver) or two-way (between a sender and a receiver or between receivers) information communication can be performed. The television device can be operated by using a switch built in the chassis 401 or a remote controller 406. A display portion 407 for displaying output information can be provided in the remote controller.

Further, the television device may include a sub screen 408 formed using a second display panel so as to display channels, volume, or the like, in addition to the main screen 403. In this structure, the main screen 403 may be formed using an EL module having a wide viewing angle, and the sub screen 408 may be formed using a liquid crystal module capable of displaying images with less power consumption. In order to reduce the power consumption preferentially, the main screen 403 may be formed using a liquid crystal module, and the sub screen 408 may be formed using an EL module, which can be switched on and off.

FIG. 21B shows a television device having a large-sized display portion, for example, a 20 to 80-inch display portion. The television device includes a chassis 410, a keyboard portion 412 that is an operation portion, a display portion 411, a speaker portion 413, and the like. A display module is used for the display portion 411. Since a bendable display module is used for the display portion 411 in FIG. 21B, the television device in which the display portion 411 is curved is formed. When a flexible display module is used in this manner, a shape of the display portion 411 is not limited to only a plane, and television devices of various shapes can be manufactured.

The yield of the display module can be improved by the present invention, and thus, cost reduction can be achieved. Accordingly, a television device using the present invention can be manufactured at low cost even when a large screen display portion is included.

Needless to say, the display module of the present invention is not limited to the television device, and can be applied to various use applications as a large-sized display medium such as an information display board at a train station, an airport, or the like, or an advertisement display board on the street, as well as a monitor of a personal computer.

Figure 21C:
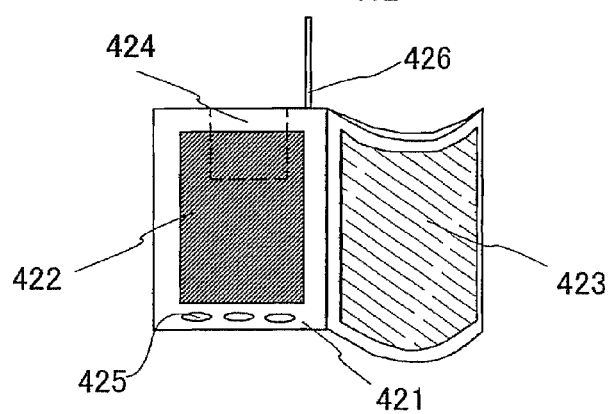

A display module of the present invention can be applied to display portions of various portable devices, such as a cellular phone or a digital camera. FIG. 21C illustrates a structural example of an e-book reader as an example of a portable appliance. The e-book reader includes a main body 421, display portions 422 and 423, a storage medium 424, an operation switch 425, an antenna 426, and the like. When a flexible display module is used for the display portion 422, reduction in weight of the portable appliance can be achieved.

Embodiment 6

This embodiment will explain that force required to generate peeling can be reduced or generation of a damage such as crack or chap to an element formation layer can be prevented by peeling of the element formation layer from a substrate while supplying liquid.

First, a method for manufacturing a sample to which a peeling test was conducted is explained.

Figure 22:
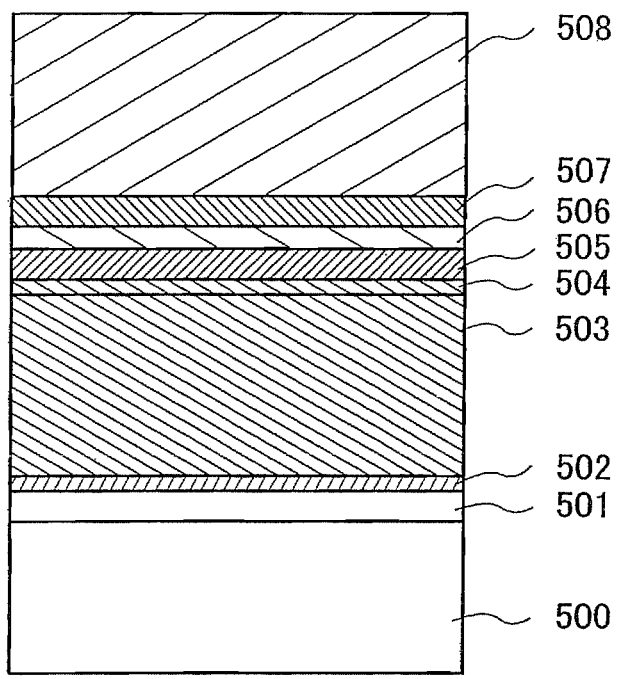
FIG. 22 is a cross-sectional diagram illustrating a stacked layer structure of a sample to which a peeling test is conducted.

FIG. 22 is a diagram for explaining a stacked structure of a sample to which the peeling test was conducted. A glass substrate 500 was prepared. Non-alkali glass manufactured by Asahi Glass Co., Ltd. (product name: AN-100) was used as the glass substrate 500. A thickness of the glass substrate is 0.7 mm and a size thereof is 100 mm×120 mm.

A silicon oxynitride ($SiO_xN_y$, x>y) film 501 was formed to have a thickness of 100 nm over the glass substrate 500 by a plasma CVD apparatus. $SiH_4$ and $N_2O$ were used as process gases for forming the silicon oxynitride film 501. A tungsten film 502 was formed to have a thickness of 50 nm over the silicon oxynitride film 501 by a sputtering apparatus. Tungsten was used for a target and an argon gas was used for a discharging gas. The tungsten film 502 functions as a peeling layer.

A stacked film of an insulating film and a semiconductor film, which is considered to be an element formation layer, is formed over the tungsten film 502. First, a silicon oxynitride ($SiO_xN_y$, x>y) film 503 was formed to have a thickness of 600 nm by a plasma CVD apparatus. $SiH_4$ and $N_2O$ were used as process gases for forming the silicon oxynitride film 503. In addition, before the silicon oxynitride film 503 was deposited on the tungsten film 502, only $N_2O$ gas was supplied to a chamber for forming the silicon oxynitride film 503 and excited into plasma, so that a surface of the tungsten film 502 was oxidized, and accordingly, tungsten oxide was formed. This plasma treatment is treatment for generating peeling more easily at an interface between the tungsten film 502 and the silicon oxynitride film 503 than at other interfaces.

A silicon oxynitride ($SiO_xN_y$, x<y) film 504 was formed to have a thickness of 100 nm over the silicon oxynitride film 503, using $SiH_4$, $H_2$, $NH_3$, and $N_2O$ for process gases with a plasma CVD apparatus. A silicon oxynitride ($SiO_xN_y$, x>y) film 505 was formed to have a thickness of 100 nm over the silicon oxynitride fim 504, using $SiH_4$ and $N_2O$ as process gases with the plasma CVD apparatus. An amorphous silicon film 506 was formed to have a thickness of 66 nm over the silicon oxynitride film 505, using $SiH_4$ and $H_2$ as process gases with the plasma CVD apparatus. The silicon oxynitride film 504, the silicon oxinitride film 505, and the amorphous silicon film 506 are formed in the same chamber of the plasma CVD apparatus. These films were continuously formed while switching the process gases to be supplied to the chamber.

Next, a silicon oxynitride ($SiO_xN_y$, x<y) film 507 was formed to have a thickness of 100 nm over the amorphous silicon film 506, using $SiH_4$, $H_2$, $N_2$, $NH_3$, and $N_2O$ as process gases with a plasma CVD apparatus. A silicon oxynitride ($SiO_xN_y$, x>y) film 508 was formed to have a thickness of 600 nm over the silicon oxynitride film 507, using $SiH_4$ and $N_2O$ as process gases with a plasma CVD apparatus.

Figure 23:
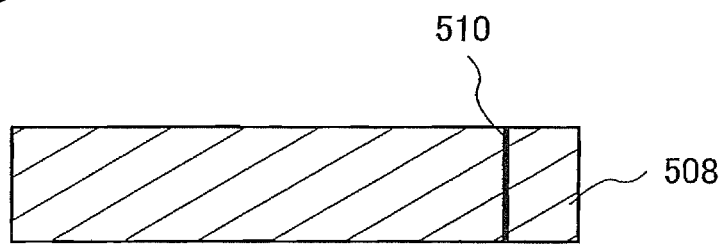
FIG. 23 is a plane diagram of a sample to which a peeling test is conducted.

Next, the glass substrate 500 over which the films 501 to 508 were formed was irradiated with UV laser light to be cut, so that strip-shape samples with a size of 20 mm×100 mm were formed. FIG. 23 illustrates a plane view of the sample processed to have a strip-shape. Next, for peeling, the sample was irradiated with UV laser light, so that a groove 510 reaching the tungsten film 502 was formed in the sample as shown in FIG. 23. By formation of the groove 510, peeling was generated between the silicon oxynitride film 503 and the tungsten film 502. By the above-described method, the sample for the peeling test was prepared.

Next, a peeling test method is explained. A heat peeling tape with a width of approximately 20 mm was prepared. Elegrip Tape (FA1250) manufactured by Denki Kagaku Kogyo Kabushiki Kaisha was used for the heat peeling tape. A combined thickness of a base material and an adhesive layer of this heat peeling tape is 150 μm, and a thickness of the adhesive layer is 50 μm. The base material of the heat peeling tape is formed of PET (polyethylene terephthalate).

The heat peeling tape was attached to the sample in which the groove had been formed. The heat peeling tape was attached on the silicon oxynitride film 508 side. When the heat peeling tape was peeled, the stacked film including the films 508 to 503 could be peeled from the substrate 500.

The heat peeling tape was pulled and tension which was needed for the stacked film including the films 508 to 503 to be peeled from the tungsten film 502 was measured. For the peeling test, a compact table-top universal tester (EZ-TEST EZ-S-50N) manufactured by Shimadzu Corporation was used. For the peeling test, an adhesive tape/adhesive sheet testing method based on standard number JIS Z0237 of Japanese Industrial Standards (JIS) was employed. Tension of each of the case where peeling was performed while supplying pure water to the sample and the case where peeling was performed without supplying pure water was measured. It is to be noted that the supply of pure water was performed in such a manner that pure water was dropped to a peeled portion with a dropper after attaching the sample to the testing machine.

Figure 24:
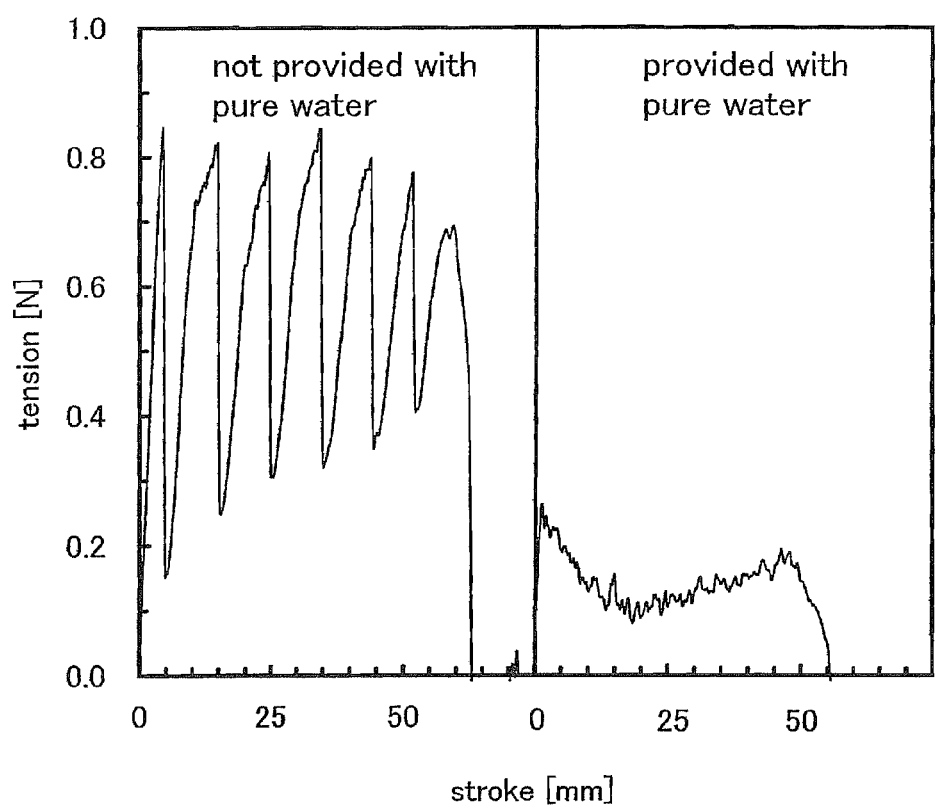
FIG. 24 is a graph illustrating a result of a peeling test.

FIG. 24 is a graph showing peeling test results. A vertical axis of FIG. 24 incidates tension applied to the heat peeling tape and a horizontal axis indicates stroke. The stroke denotes displacement of point of application of force, which means displacement of a point where peeling is generated.

According to the graph of FIG. 24, the tension of the case of supplying pure water was less than half of that of the case of not supplying pure water. According to this peeling test, it was confirmed that peeling could be performed with less force by supply of pure water.

In addition, in the case where the peeling test was conducted without supply of pure water, FIG. 24 shows a sawtooth profile. The sawtooth profile shows that peeling proceeds as below. In the case where peeling is performed without supply of pure water, stronger force is given to the point of application than in the case of supplying pure water in order to progress peeling, whereas when peeling proceeds, the force is rapidly decreased. Peeling proceeds with such repeated increase and rapid decrease of the force applied to the point of application. When the sample peeled without supply of pure water was observed, it was confirmed that crack was generated in a portion where the tension was rapidly decreased. On the other hand, crack was not generated in the sample to which the peeling test was conducted while suppplying pure water. As described above, it was found that generation of crack could be prevented by peeling with supply of pure water.

Although pure water is polar liquid, the peeling test was conducted while supplying nonpolar liquid in which a medium is nonpolar for comparison. For example, hydrofluoroether (HFE) was used for liquid. In the case of conducting the peeling test while supplying HFE, higher tension was needed than in the case of not supplying liquid. Also in the case of using benzene, the result was similar to that of the case of using HFE.

According to the above-described peeling test, the following was found. Peeling while supplying polar liquid such as pure water, a solution, ethanol, or acetone makes it possible to prevent electric dicharge due to peeling electrification, reduce force needed for peeling, and prevent generation of damage such as crack to an object to be peeled.

This application is based on Japanese Patent Application serial no. 2006-266531 filed in Japan Patent Office on Sep. 29, in 2006, the entire contents of which are hereby incorporated by reference.

What is claimed is:

1. A method for manufacturing a semiconductor device, comprising:
   supplying a film from a supplying roller;
   providing an element formation layer on a substrate with a peeling layer therebetween, the element formation layer comprising a semiconductor element;
   pressing the film supplied by the supplying roller to the element formation layer between a first pressurization roller and a second pressurization roller;
   bending the film by using the first pressurization roller, whereby peeling the element formation layer from the substrate;
   supplying a liquid to a portion where the peeling occurs, whereby wetting the element formation layer and the peeling layer at an edge portion of the peeling;
   separating the element formation layer from the substrate; and
   collecting the film with a collecting roller so that a portion of the film is firstly supplied by the supplying roller, then is pressed between the first pressurization roller, and is finally collected by the collecting roller.

2. A method for manufacturing a semiconductor device, comprising:
   supplying a film from a supplying roller;
   providing an element formation layer on a substrate with a peeling layer therebetween, the element formation layer comprising a semiconductor element;
   attaching the film supplied by the supplying roller to the element formation layer via an adhesive layer by pressing the film to the element formation layer between a first pressurization roller and a second pressurization roller;
   bending the film by using the first pressurization roller, whereby peeling the element formation layer from the substrate;
   supplying a liquid to a portion where the peeling occurs, whereby wetting the element formation layer and the peeling layer at an edge portion of the peeling;
   separating the element formation layer from the substrate; and
   collecting the film with a collecting roller so that a portion of the film is firstly supplied by the supplying roller, then is pressed between the first pressurization roller, and is finally collected by the collecting roller.

3. The method for manufacturing a semiconductor device according to claim 1,
   wherein an adhesive layer is pressed between the film and the element formation layer.

4. The method for manufacturing a semiconductor device according to claim 2,
   wherein an adhesive layer is pressed between the film and the element formation layer.

5. The method for manufacturing a semiconductor device according to claim 1, further comprising:
   forming a metal film or an alloy film on the substrate; and
   forming an oxide film on and in contact with the metal film or the alloy film, whereby forming the peeling layer.

6. The method for manufacturing a semiconductor device according to claim 2, further comprising:
   forming a metal film or an alloy film on the substrate; and
   forming an oxide film on and in contact with the metal film or the alloy film, whereby forming the peeling layer.

7. The method for manufacturing a semiconductor device according to claim 5,
   wherein the metal film of the alloy film comprises a metal selected from tungsten, molybdenum, titanium, tantalum, niobium, nickel, cobalt, zirconium, zinc, ruthenium, rhodium, palladium, osmium, and iridium.

8. The method for manufacturing a semiconductor device according to claim 6,
   wherein the metal film of the alloy film comprises a metal selected from tungsten, molybdenum, titanium, tantalum, niobium, nickel, cobalt, zirconium, zinc, ruthenium, rhodium, palladium, osmium, and iridium.

9. The method for manufacturing a semiconductor device according to claim 5,
   wherein the metal film of the alloy film is a tungsten film.

10. The method for manufacturing a semiconductor device according to claim 6,
    wherein the metal film of the alloy film is a tungsten film.

11. The method for manufacturing a semiconductor device according to claim 5,
wherein a surface of the metal film or of the alloy film is oxidized when the oxide film is formed.

12. The method for manufacturing a semiconductor device according to claim 6,
wherein a surface of the metal film or of the alloy film is oxidized when the oxide film is formed.

13. The method for manufacturing a semiconductor device according to claim 1,
wherein peeling occurs between the element formation layer and the peeling layer.

14. The method for manufacturing a semiconductor device according to claim 2,
wherein peeling occurs between the element formation layer and the peeling layer.

15. The method for manufacturing a semiconductor device according to claim 1,
wherein the liquid is pure water.

16. The method for manufacturing a semiconductor device according to claim 2,
wherein the liquid is pure water.

17. The method for manufacturing a semiconductor device according to claim 1,
wherein the semiconductor device is a display module comprising a flexible circuit and a light-emitting element each connected to the semiconductor element.

18. The method for manufacturing a semiconductor device according to claim 2,
wherein the semiconductor device is a display module comprising a flexible circuit and a light-emitting element each connected to the semiconductor element.

19. A manufacturing apparatus comprising:
a supplying roller configured to supply a film;
a first pressurization roller and a second pressurization roller configured to press the film to an element formation layer, the element formation layer being attached to a substrate via a peeling layer;
a collecting roller configured to collect the film after it has been pressed between the first pressurization roller and the second pressurization roller; and
a liquid supplying nozzle configured to supply a liquid,
wherein the manufacturing apparatus is configured to attach the film to the element formation layer and to peel the element formation layer from the substrate by bending the film and the element formation layer by using the first pressurization roller, after they have been attached to each other, and
wherein the manufacturing apparatus is configured to supply the liquid to a portion where the peeling occurs, whereby wetting the element formation layer and the peeling layer at an edge portion of the peeling.

20. The manufacturing apparatus according to claim 19,
wherein the film and the element formation layer are attached to each other by being pressed to each other by the first pressurization roller and the second pressurization roller.

* * * * *